(12) United States Patent
Wong et al.

(10) Patent No.: US 9,692,232 B2
(45) Date of Patent: Jun. 27, 2017

(54) MIXED SIGNAL CONTROLLER

(71) Applicant: University of Macau, Macau (CN)

(72) Inventors: Man-Chung Wong, Macau (CN);
Chi-Seng Lam, Macau (CN);
Yan-Zheng Yang, Macau (CN);
Wai-Hei Choi, Macau (CN); Ning-Yi Dai, Macau (CN); Yajie Wu, Macau (CN); Chi-Kong Wong, Macau (CN);
Sai-Weng Sin, Macau (CN); U-Fat Chio, Macau (CN); Seng-Pan U, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 15/218,070

(22) Filed: Jul. 24, 2016

(65) Prior Publication Data
US 2017/0141571 A1    May 18, 2017

Related U.S. Application Data

(60) Provisional application No. 62/254,724, filed on Nov. 13, 2015.

(51) Int. Cl.
*H03L 5/00* (2006.01)
*H02J 3/01* (2006.01)
*H02J 3/18* (2006.01)

(52) U.S. Cl.
CPC .  *H02J 3/01* (2013.01); *H02J 3/18* (2013.01)

(58) Field of Classification Search
CPC ..... H02J 3/01; H02J 3/18; H03K 5/02; H03K 5/04; H03K 5/007; H02M 3/155; H02M 3/156; H02M 3/1566; H04B 2215/069
USPC ............... 327/306–333, 374–378, 419–437, 327/172–175; 323/265, 266, 282–285, 323/288–290
See application file for complete search history.

(56) References Cited

U.S. PATENT DOCUMENTS

| | | |
|---|---|---|
| 7,772,904 B1 | 8/2010 | Cooke |
| 8,614,595 B2 | 12/2013 | Acatrinei |
| 2008/0129263 A1 | 6/2008 | Kotikalapoodi et al. |

OTHER PUBLICATIONS

R. Walker. Microprocessors in perspective. Electron. Power, vol. 20, pp. 528-530, Jul. 1974.

(Continued)

*Primary Examiner* — Lincoln Donovan
*Assistant Examiner* — Diana J Cheng
(74) *Attorney, Agent, or Firm* — Eagle IP Limited; Jacqueline C. Lui

(57) ABSTRACT

A mixed signal controller for a power quality compensator includes an analog circuit, an analog-to-digital converter (ADC), and a digital circuit. The analog circuit amplifies an input signal from the power quality compensator by a gain factor and outputs an analog signal, which is converted to a digital signal by the ADC. The digital circuit receives the digital signal, calculates the reference compensating current of each phase and then generates a trigger signal via hysteresis PWM to the power quality compensator. The digital circuit includes an evaluation circuit that calculates a value of the system total harmonic distortion after the power quality compensator compensates power and adjusts the gain factor when the value of the system total harmonic distortion reaches a predetermined threshold.

17 Claims, 25 Drawing Sheets

(56) References Cited

OTHER PUBLICATIONS

A. K. Chattopadhyay and N. Meher. Microprocessor implementation of a state feedback control strategy for a current source inverter-fed induction motor drive. IEEE Trans. Power Electron., vol. 4, No. 2, pp. 279-288, Apr. 1989.

J. R. Boddie. Digital signal processor: overview: The device, support facilities, and applications. Bell Syst. Tech. J., vol. 60, pp. 1431-1439, Sep. 1981.

X. Wang and B.-T. Ooi. Real-time multi-DSP control of three-phase current-source unity power factor PWM rectifier. IEEE Trans. Power Electron., vol. 8, No. 3, pp. 295-300, Jul. 1993.

J. Rose, R. J. Francis, D. Lewis, and P Chow. Architecture of field-programmable gate arrays: The effect of logic block functionality of area efficiency. IEEE J. Solid-State Circuit, vol. 25, No. 5, pp. 1217-1225, Oct. 1990.

E. K. F. Lee and P. Glenn Gulak. A CMOS field-programmable analog array. IEEE J. Solid-State Circuit, vol. 26, No. 12, pp. 1860-1867, Dec. 1991.

E. Monmasson, L. Idkhajine, and M. W. Naouar. FPGA-based controllers—Different perspectives of power electronics and drive applications. IEEE Ind. Electron. Mag., vol. 5, No. 1, pp. 14-26, Mar. 2011.

M. R. Dadash Zadeh, T. S. Sidhu, and A. Klimek. FPAA-based mho distance relay considering CVT transiente supervision. IET Gener., Transmiss. Distrib., vol. 3, No. 7, pp. 616-627, Jul. 2009.

M. R. Dadash Zadeh, T. S. Sidhu, and A. Klimek. Field-programmable analog array based distance relay. IEEE Trans. Power Del., vol. 24, No. 3, pp. 1063-1071, Jul. 2009.

T.S. Hall, C. M. Twigg, J.D. Gray, P. Hasler, and D. V. Anderson. Large-scale field-programmable analog arrays for analog signal processing. IEEE Trans. Circuits Syst. I, vol. 52, No. 11, pp. 2298-2307, Nov. 2005.

S. Suh, A. Basu, C. Schlottmann, P. E. Hasler, and J. R. Barry. Low-power discrete Fourier transform for OFDM: A programmable analog approach. IEEE Trans. Circuits Syst. I, vol. 58, No. 2, pp. 290-298, Feb. 2001.

D. Keymeulen, A. Stoica, R. Zenulum, S. Katkoori, P. Fernando, H. Sankaran, M. Mojarradi, and T. Daud. Self-reconfigurable analog array integrated circuit architecture for space applications. In Proc. NASA/ESA Conf. Adapt. Hardw. Syst., Jun. 2008, pp. 83-90.

A. Laknaur and H. Wang. A methodology to perform online self-testing for field-programmable analog array circuits. IEEE Trans. Instrum. Meas., vol. 54, No. 5, pp. 1751-1760, Oct. 2005.

R. Girardey, M. Hubner, and J. Becker. Dynamic reconfigurable mixed-signal architecture for safety critical applications. in Proc. Int. Conf. Field Program. Logic Appl., Aug./Sep. 2009, pp. 503-506.

S. C. Huerta, P. Alou, O. Garcia, J. A. Oliver, R. Prieto, and J. Cobos. Hysteretic mixed-signal controller for high-frequency dc-dc converters operating at constant switching frequency. IEEE Trans. Power Electron., vol. 27, No. 6, pp. 2690-2696, Jun. 2012.

J. Wang, A. Prodić, and W. Tung Ng. Mixed-signal-controlled flyback-transformer-based buck converter with improved dynamic performance and transient energy recycling. IEEE Trans. Power Electron., vol. 28, No. 2, pp. 970-984, Feb. 2013.

S. Saggini, P. Mattavelli, G. Garcea, and M. Ghioni. A mixed-signal synchronous /asynchronous control for high-frequency dc-dc boost converters. IEEE Trans. Ind. Electron., vol. 55, No. 5, pp. 2053-2060, May 2008.

L. Dorie and O. Hammami. A combined FPAA-FPGA platform for mixed-signals design space exploration. in Proc. IEEE 12th Int. Conf. Electron., Circuits Syst., Dec. 2005, pp. 1-4.

Anadigm, Inc. The dpASP Company. Anadigm Apex dpASP Family User Manual. (2008). [Online]. UM000231-u001e. Available: http://www.anadigm.com/.

Terasic Technologies, Inc. Terasic DE2-115 User Manual. (2013). [On-line]. Available: www.terasic.com.

C.-S. Lam, W.-H. Choi, M.-C. Wong, and Y.-D. Han. Adaptive dc-link voltage controlled hybrid active power filters for reactive power compensation. IEEE Trans. Power Electron., vol. 27, No. 4, pp. 1758-1772, Apr. 2012.

C.-S. Lam, X.-X. Cui, W.-H. Choi, M.-C. Wong, and Y.-D. Han. Minimum inverter capacity design for three-phase four-wire LC-hybrid active power filters. IET Power Electron., vol. 5, No. 7, pp. 956-968, Aug. 2012.

W.-H. Choi, C.-S. Lam, M.-C. Wong, and Y.-D. Han. Analysis of dc-link voltage controls in three-phase four-wire hybrid active power filters. IEEE Trans. Power Electron., vol. 28, No. 5, pp. 2180-2191, May 2013.

D.M. Brod and D. W. Novotny. Current control of VSI-PWM inverters. IEEE Trans. Ind. Appl., vol. IA-21, No. 3, pp. 562-570, May 1985.

IEEE Recommended Practices and Requirements for Harmonic Control in Electrical Power Systems. IEEE Standard 519-1992, 1992.

M. K. Mishra, A. Ghosh, A. Joshi, and H. M. Suryawanshi. A novel method of load compensation under unbalanced and distorted voltages. IEEE Trans. Power Del., vol. 22, No. 1, pp. 288-295, Jan. 2007.

Code of practice for energy efficiency of electrical installation, Electrical and Mechanical Services Department, The Hong Kong SAR Government, Hong Kong, 2005.

700 →

| HB (pu) | | $I_{tp}$ (pu) | | | | | | | | |
|---|---|---|---|---|---|---|---|---|---|---|
| | | 0.1 | 0.2 | 0.3 | 0.4 | 0.5 | 0.6 | 0.7 | 0.8 | 0.9 | 1.0 |
| 0.1 | THD (%) | 82.39 | 41.95 | 27.14 | 20.25 | 16.08 | 14.10 | 11.48 | 10.08 | 8.99 | 8.170 |
| | ATHD (%) | 81.65 | 40.82 | 27.22 | 20.41 | 16.33 | 13.61 | 11.66 | 10.21 | 9.07 | 8.165 |
| 0.2 | THD (%) | 161.3 | 84.82 | 52.25 | 40.53 | 33.94 | 27.71 | 23.39 | 19.25 | 18.21 | 15.58 |
| | ATHD (%) | 163.3 | 81.65 | 54.43 | 40.82 | 32.66 | 27.22 | 23.33 | 20.41 | 18.14 | 16.33 |
| 0.3 | THD (%) | 230.8 | 126.8 | 87.51 | 60.48 | 46.32 | 39.50 | 36.43 | 30.99 | 27.32 | 23.35 |
| | ATHD (%) | 244.9 | 122.5 | 81.65 | 61.24 | 48.99 | 40.82 | 34.99 | 30.62 | 27.22 | 24.49 |
| 0.4 | THD (%) | 324.6 | 162.7 | 120.0 | 85.70 | 64.13 | 52.56 | 46.87 | 39.87 | 34.85 | 33.24 |
| | ATHD (%) | 326.6 | 163.3 | 108.9 | 81.65 | 65.32 | 54.43 | 46.66 | 40.82 | 36.29 | 32.66 |
| 0.5 | THD (%) | 416.4 | 221.5 | 119.4 | 103.5 | 79.23 | 69.22 | 60.97 | 50.14 | 42.63 | 40.59 |
| | ATHD (%) | 408.2 | 204.1 | 136.1 | 102.1 | 81.65 | 68.04 | 58.32 | 51.03 | 46.36 | 40.82 |
| 0.6 | THD (%) | 550.6 | 250.0 | 166.3 | 124.3 | 91.52 | 81.49 | 67.66 | 59.36 | 53.84 | 48.67 |
| | ATHD (%) | 489.9 | 244.9 | 163.3 | 122.5 | 97.98 | 81.65 | 69.99 | 61.24 | 54.43 | 48.99 |
| 0.7 | THD (%) | 561.8 | 276.2 | 203.8 | 124.8 | 119.4 | 105.1 | 80.54 | 67.83 | 62.84 | 57.06 |
| | ATHD (%) | 571.5 | 285.8 | 190.5 | 142.9 | 114.3 | 95.26 | 81.65 | 71.44 | 63.51 | 57.15 |
| 0.8 | THD (%) | 664.9 | 328.5 | 231.4 | 167.0 | 135.7 | 110.8 | 92.66 | 82.21 | 70.87 | 63.86 |
| | ATHD (%) | 653.2 | 326.6 | 217.7 | 163.3 | 130.6 | 108.9 | 93.31 | 81.65 | 72.58 | 65.32 |
| 0.9 | THD (%) | 775.4 | 375.7 | 259.4 | 166.6 | 155.6 | 117.3 | 114.2 | 92.36 | 80.30 | 71.26 |
| | ATHD (%) | 734.8 | 367.4 | 244.9 | 183.7 | 147.0 | 122.5 | 105.0 | 91.86 | 81.65 | 73.48 |
| 1.0 | THD (%) | 801.9 | 361.2 | 268.5 | 201.7 | 167.8 | 147.7 | 114.3 | 107.3 | 93.43 | 84.48 |
| | ATHD (%) | 816.3 | 408.2 | 272.2 | 204.1 | 163.3 | 136.1 | 116.6 | 102.1 | 90.72 | 81.65 |

| HB (pu) Average $\Delta_{ATHD}$ | | $I_{tp}$ (pu) | | | | | | | | |
|---|---|---|---|---|---|---|---|---|---|---|
| | | 0.1 | 0.2 | 0.3 | 0.4 | 0.5 | 0.6 | 0.7 | 0.8 | 0.9 | 1.0 |
| 0.1 | $\Delta_{ATHD}$ (%) | 0.90 | 2.69 | 0.29 | 0.79 | 1.55 | 3.48 | 1.57 | 1.29 | 0.89 | 0.06 |
| 0.2 | $\Delta_{ATHD}$ (%) | 1.24 | 2.82 | 4.17 | 0.72 | 3.77 | 1.77 | 0.26 | 6.03 | 0.38 | 4.81 |
| 0.3 | $\Delta_{ATHD}$ (%) | 10.91 | 3.39 | 6.70 | 1.26 | 5.78 | 3.34 | 3.95 | 0.91 | 0.37 | 4.88 |
| 0.4 | $\Delta_{ATHD}$ (%) | 0.62 | 0.37 | 9.25 | 4.73 | 1.86 | 3.56 | 0.45 | 2.38 | 4.13 | 1.74 |
| 0.5 | $\Delta_{ATHD}$ (%) | 1.97 | 7.86 | 13.99 | 1.35 | 3.05 | 1.70 | 4.35 | 1.78 | 6.40 | 0.57 |
| 0.6 | $\Delta_{ATHD}$ (%) | 11.02 | 2.04 | 1.80 | 1.45 | 7.06 | 0.20 | 3.44 | 3.17 | 1.10 | 0.66 |
| 0.7 | $\Delta_{ATHD}$ (%) | 1.73 | 3.48 | 6.83 | 14.50 | 4.27 | 9.36 | 1.38 | 5.79 | 1.07 | 0.16 |
| 0.8 | $\Delta_{ATHD}$ (%) | 1.76 | 1.90 | 5.92 | 2.22 | 3.76 | 1.71 | 0.70 | 0.68 | 2.41 | 2.29 |
| 0.9 | $\Delta_{ATHD}$ (%) | 5.24 | 2.21 | 5.59 | 10.26 | 8.53 | 4.43 | 8.06 | 0.54 | 1.68 | 3.12 |
| 1.0 | $\Delta_{ATHD}$ (%) | 1.82 | 13.01 | 1.38 | 1.19 | 2.68 | 7.85 | 2.01 | 4.85 | 2.98 | 3.35 |

Figure 8

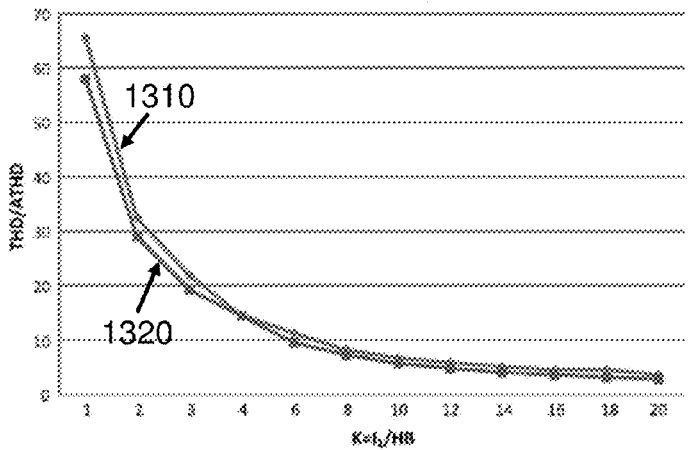

Figure 13

| System parameters | | Physical values |
|---|---|---|
| Source | $V_{Lx}, L_s$ | 110 V, 1 mH |
| Passive part | $L_c, C_c$ | 10 mH, 40 μF |
| 20% Testing Load | | |
| Nonlinear rectifier load (Inductor, resistor, capacitor) | $L_{NLx}, R_{NLx}, C_{NLx}$ | 35 mH, 169 Ω, 373 uF |
| 50% Testing Load | | |
| Nonlinear rectifier load (Inductor, resistor, capacitor) | $L_{NLx}, R_{NLx}, C_{NLx}$ | 35 mH, 55 Ω, 373 uF |
| 70% Testing Load | | |
| Nonlinear rectifier load (Inductor, resistor, capacitor) | $L_{NLx}, R_{NLx}, C_{NLx}$ | 35 mH, 55 Ω, 373 uF |
| Linear load (Inductor, resistor) | $L_{Lx}, R_{Lx}$ | 0 mH, 100 Ω |
| 90% Testing Load | | |
| Nonlinear rectifier load (Inductor, resistor, capacitor) | $L_{NLx}, R_{NLx}, C_{NLx}$ | 35 mH, 55 Ω, 373 uF |
| Linear load (Inductor, resistor) | $L_{Lx}, R_{Lx}$ | 0 mH, 50 Ω |

|  |  | Before compensation | | | After compensation | | | | | |
|---|---|---|---|---|---|---|---|---|---|---|
|  |  |  |  |  | Conventional controller | | | Proposed controller | | |
| Different cases | | $i_{s,s}$ (A) | PF | $THD_{i,s}$ (%) | $i_{s,s}$ (A) | PF | $THD_{i,s}$ (%) | $i_{s,s}$ (A) | PF | $THD_{i,s}$ (%) |
| 20% load | A | 1.09 | 0.81 | 52.5 | 1.38 | 0.91 | 20.7 | 1.33 | 0.94 | 13.9 |
|  | B | 1.08 | 0.81 | 51.9 | 1.46 | 0.93 | 21.1 | 1.38 | 0.94 | 15.8 |
|  | C | 1.07 | 0.81 | 53.3 | 1.50 | 0.90 | 22.1 | 1.38 | 0.93 | 15.0 |
| 50% load | A | 2.51 | 0.88 | 35.6 | 2.18 | 0.98 | 17.6 | 2.09 | 0.99 | 10.8 |
|  | B | 2.47 | 0.88 | 35.5 | 2.16 | 0.98 | 17.1 | 2.13 | 0.99 | 11.9 |
|  | C | 2.51 | 0.88 | 34.4 | 2.18 | 0.98 | 18.7 | 2.11 | 0.99 | 10.5 |
| 70% load | A | 3.59 | 0.90 | 23.7 | 3.26 | 1.0 | 6.3 | 3.25 | 1.0 | 5.7 |
|  | B | 3.49 | 0.90 | 23.7 | 3.30 | 0.99 | 7.7 | 3.28 | 1.0 | 6.1 |
|  | C | 3.42 | 0.90 | 24.4 | 3.28 | 0.99 | 7.5 | 3.27 | 0.99 | 6.4 |
| 90% load | A | 4.55 | 0.95 | 17.6 | 4.47 | 1.0 | 5.9 | 4.39 | 1.0 | 5.6 |
|  | B | 4.47 | 0.95 | 17.4 | 4.41 | 1.0 | 7.1 | 4.39 | 1.0 | 8.7 |
|  | C | 4.64 | 0.95 | 16.6 | 4.57 | 1.0 | 7.8 | 4.50 | 1.0 | 7.5 |

Figure 23

MIXED SIGNAL CONTROLLER

FIELD OF THE INVENTION

The present invention relates to a method and system that includes a mixed signal controller that controls power quality compensators.

BACKGROUND

Nonlinear, inductive, and unbalanced loads cause power quality issues such as transmission losses and damages to electronic devices. Power quality compensators such as passive power filters (PPFs), active power filters (APFs), and hybrid active power filters (HAPFs) have been developed to solve these problems.

New methods and systems that improve the compensation performance of the power quality compensators will assist in advancing technological needs and solving technological problems.

BRIEF DESCRIPTION OF THE DRAWINGS

FIG. 7 shows simulated total harmonic distortion (THD) and approximate total harmonic distortion (ATHD) values in accordance with an example embodiment.

FIG. 8 shows simulated absolute percentage error $|\Delta_{ATHD}|$ of ATHD compared with THD in accordance with an example embodiment.

FIG. 13 shows simulated THD and ATHD curves in accordance with an example embodiment.

FIG. 14 lists simulated and experimental system parameters in accordance with an example embodiment.

FIG. 23 summarizes experimental compensation results of a three-phase power system after HAPF compensation with a digital controller compared with a mixed signal controller.

SUMMARY OF THE INVENTION

Figure 1:
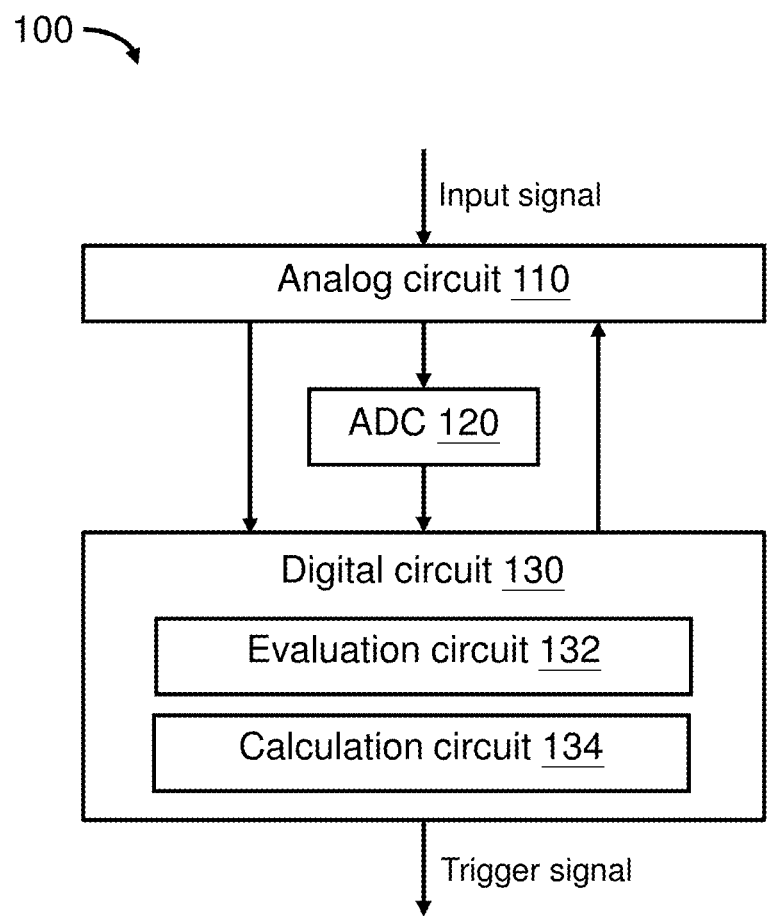
FIG. 1 shows a mixed signal controller in accordance with an example embodiment.

One example embodiment is a mixed signal controller for a power quality compensator that includes an analog circuit, an analog-to-digital converter (ADC), and a digital circuit. The analog circuit amplifies an input signal from the power quality compensator by a gain factor and outputs an analog signal, which is converted to a digital signal by the ADC. The digital circuit receives the digital signal, calculates the reference compensating current of each phase and generates a trigger signal via hysteresis PWM to the power quality compensator. The digital circuit includes an evaluation circuit that calculates a value of the system total harmonic distortion after the power quality compensator compensates power and adjusts the gain factor when the value of the system total harmonic distortion reaches a predetermined threshold.

Other example embodiments are discussed herein.

DETAILED DESCRIPTION

Examples embodiments relate to system and methods that control power quality compensators via mixed signal controllers.

Various algorithms have been proposed to improve compensation performance of power quality compensators by increasing response speed and reducing the total harmonic distortion (THD). Existing power quality compensators usually execute compensation control algorithms via a digital controller.

Most digital controllers are designed for a full loading situation. The full analog-to-digital conversion input signal range of a digital controller is utilized to avoid analog signal saturation. In a light loading situation, the digital controller may suffer from low resolution. International standards of compensation performance requires the THD to be less than 20%, which is hard to meet for light loading power systems due to the low resolution of the input signals compared with the error signal and the Pulse Width Modulation (PWM) error margin. An example embodiment can relax these problems related to power quality compensation.

In one example embodiment, a self-configuration control algorithm for a power quality compensator is executed by a mixed signal controller that includes an analog circuit, such as a field programmable analog array (FPAA) and a digital circuit, such as a field programmable gate array (FPGA) or a digital signal processor (DSP) circuit. The mixed signal controller improves power compensation quality with adaptive gain, on-the-fly programmability and self-reconfiguration properties in a three-phase four-wire HAPF system. An approximate total harmonic distortion (ATHD) is calculated in real time to detect the compensation performance instantaneously. Gains are calculated in the FPGA and transferred by a feedback loop to the FPAA in a dynamic configuration process.

In one example embodiment, an ATHD index is calculated to determine the total harmonic distortion value in real time, which reduces the evaluation time of the power quality compensation system performance.

In another embodiment, a hysteresis error margin or a hysteresis band (HB) is designed with hysteresis pulse width modulations to determine the ATHD of the power quality compensator instantaneously. When an actual current is greater than a reference current by a HB value, an inverter leg in the power quality compensator is switched on. When the actual current is less than the reference current by the HB value, the inverter leg is witched off. The HB specifies the maximum current ripple.

In another embodiment, the analog circuit of the mixed signal controller amplifies an input signal from the power quality compensator by a gain factor. The digital circuit of the mixed signal controller calculates a value of the system total harmonic distortion after the power quality compensator compensates power and adjusts the gain factor when the value of the system total harmonic distortion reaches a predetermined threshold. The analog circuit and the digital circuit communicates directly with each other. Gains are calculated in the digital circuit and sent back to the analog circuit in a dynamic configuration process.

FIG. 1 shows a mixed signal controller 100 in accordance with an example embodiment. The mixed signal controller 100 includes an analog circuit 110, an analog-to-digital converter (ADC) 120 and a digital circuit 130. The digital circuit 130 includes an evaluation circuit 132 and a calculation circuit 134.

As one example, the analog circuit 110 amplifies an input signal from the power quality compensator by a first gain factor and outputs an analog signal. The analog signal is converted to a digital signal by the ADC. The digital circuit receives the digital signal from the ADC 120, then calculates the reference compensating current of each phase and then generates a trigger signal to the power quality compensator.

In an example embodiment, the trigger signal generated by the digital circuit 130 is a pulse width modulation (PWM) signal that controls a switching device of the power quality compensator.

In an example embodiment, the evaluation circuit 132 calculates a value of the system total harmonic distortion after the power quality compensator compensates power and adjusts the first gain factor when the value of the system total harmonic distortion reaches a predetermined threshold. By way of example, the value of the system total harmonic distortion is an approximate total harmonic distortion (ATHD) that is calculated instantaneously without frequency spectrum computation by the following equation:

$$ATHD = \sqrt{\frac{2}{3}} \frac{HB}{I_{1p}},$$

where $I_{1p}$ is a peak value of a sinusoidal current, and HB is a hysteresis band value that specifies a maximum variation of the current. ATHD is defined as a fast evaluation index of compensation performance instead of THD, in which the HB of the ATHD can be determined according to hysteresis pulse width modulation (PWM) or the compensation error of space vector modulation.

In an example embodiment, the calculation circuit 134 calculates a second gain factor and sends the second gain factor to the analog circuit. The analog circuit compares the second gain factor to a predetermined value and adjusts the first gain factor to decrease the system total harmonic distortion after the power quality compensator compensates power when the second factor is different than the predetermined value. By way of example, the second gain factor is given by the following equation:

$$G = INT\left(\frac{W}{R}\right),$$

where INT is an integer function, W is a measured amplitude width of the digital signal out of the ADC, and R is a peak-to-peak range of the input signal.

As one example, the analog circuit 110 detects saturation by comparing the second gain factor sent from the digital circuit with a predetermined value and adjusts the first gain factor when the second gain factor is different than the predetermined value. As another example, saturation occurs when the second gain factor equals to 1.

Figure 2:
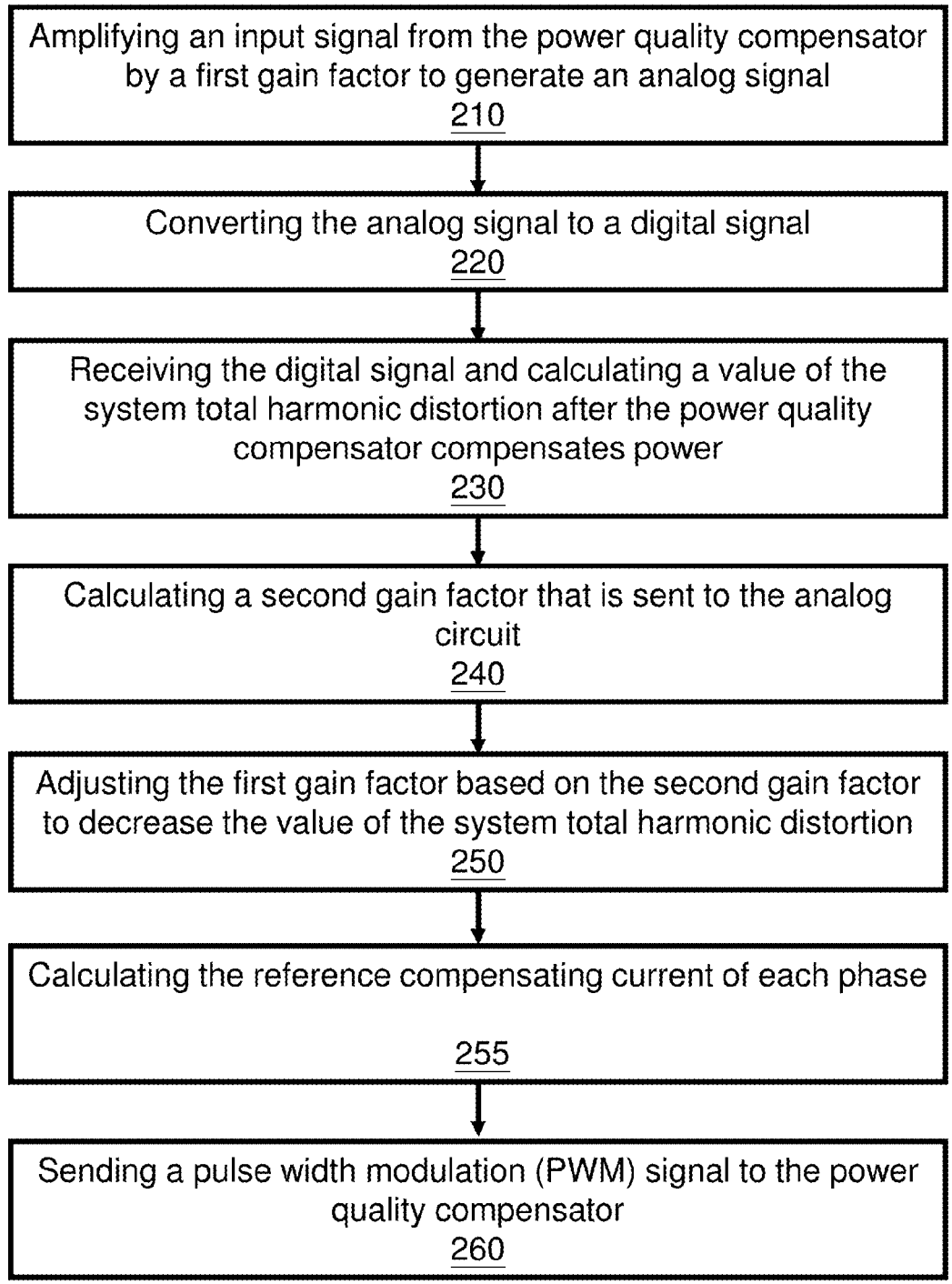
FIG. 2 shows a method executed by a mixed signal controller to control a power quality compensator in accordance with an example embodiment.

FIG. 2 shows a method executed by a mixed signal controller to control a power quality compensator in accordance with an example embodiment.

Block 210 states amplifying an input signal from the power quality compensator by a first gain factor to generate an analog signal.

Consider an example in which a mixed signal controller includes an analog circuit, an analog-to-digital converter (ADC) and a digital circuit. The digital circuit includes an evaluation circuit and a calculation circuit.

As one example, the analog circuit amplifies an input signal from the power quality compensator by a first gain factor and outputs an analog signal.

Block 220 states converting the analog signal to a digital signal.

In one example embodiment, the analog-to-digital converter (ADC) converts the analog signal sent from the analog circuit to a digital signal and sends the digital signal to the digital circuit.

Block 230 states receiving the digital signal and calculating a value of the system total harmonic distortion after the power quality compensator compensates power.

By way of example, the digital circuit receives the digital signal from the ADC and calculates an approximate total harmonic distortion (ATHD) that is calculated instantaneously without frequency spectrum computation by the following equation:

$$ATHD = \sqrt{\frac{2}{3}} \frac{HB}{I_{1p}},$$

where $I_{1p}$ is a peak value of a sinusoidal current, and HB is a hysteresis band value that specifies a maximum variation of the current. ATHD is defined as a fast evaluation index of compensation performance instead of THD, in which the HB of the ATHD can be determined according to hysteresis pulse width modulation (PWM) or the compensation error of space vector modulation.

Block 240 states calculating a second gain factor that is sent to the analog circuit.

As one example, the digital circuit calculates a second gain factor and sends the second gain factor to the analog circuit. By way of example, the second gain factor is given by the following equation:

$$G = INT\left(\frac{W}{R}\right),$$

where INT is an integer function, W is a measured amplitude width of the digital signal out of the ADC, and R is a peak-to-peak range of the input signal.

Block 250 states adjusting the first gain factor based on the second gain factor to decrease the value of the system total harmonic distortion.

As one example, the analog circuit receives the second gain factor calculated by the digital circuit and compares the second gain factor to a predetermined value. When the second factor is different than the predetermined value, the analog circuit adjusts the first gain factor to decrease the system total harmonic distortion after the power quality compensator compensates power and to avoid situation.

Block 255 states calculating the reference compensating current of each phase.

By way of example, the reference compensating current $i^*_{cx}$ for a HAPF shown is given by the following equation:

$$i^*_{cx} = \left(i_{La} - \frac{\overline{p}}{v^2}v_{La}\right)\vec{n_a} + \left(i_{Lb} - \frac{\overline{p}}{v^2}v_{Lb}\right)\vec{n_b} + \left(i_{Lc} - \frac{\overline{p}}{v^2}v_{Lc}\right)\vec{n_c},$$

where $\{\vec{n_a}, \vec{n_b}, \vec{n_c}\}$ is the space basis in the a-b-c coordinate, $p = v_{La}i_{La} + v_{Lb}i_{Lb} + v_{Lc}i_{Lc}$, and $\overline{p}$ is an average value of the instantaneous power p.

Block 260 states sending a pulse width modulation (PWM) signal to the power quality compensator.

In an example embodiment, the mixes signal controller controls a voltage source PWM inverter via hysteresis current control, in which a sinusoidal reference current is compared with an actual current. When the actual current is greater than the reference current by a hysteresis band (HB) value, the inverter leg is witched on. When the actual current is less than the reference current by the HB value, the inverter leg is witched off. The HB specifies the maximum current ripple.

Figure 3:
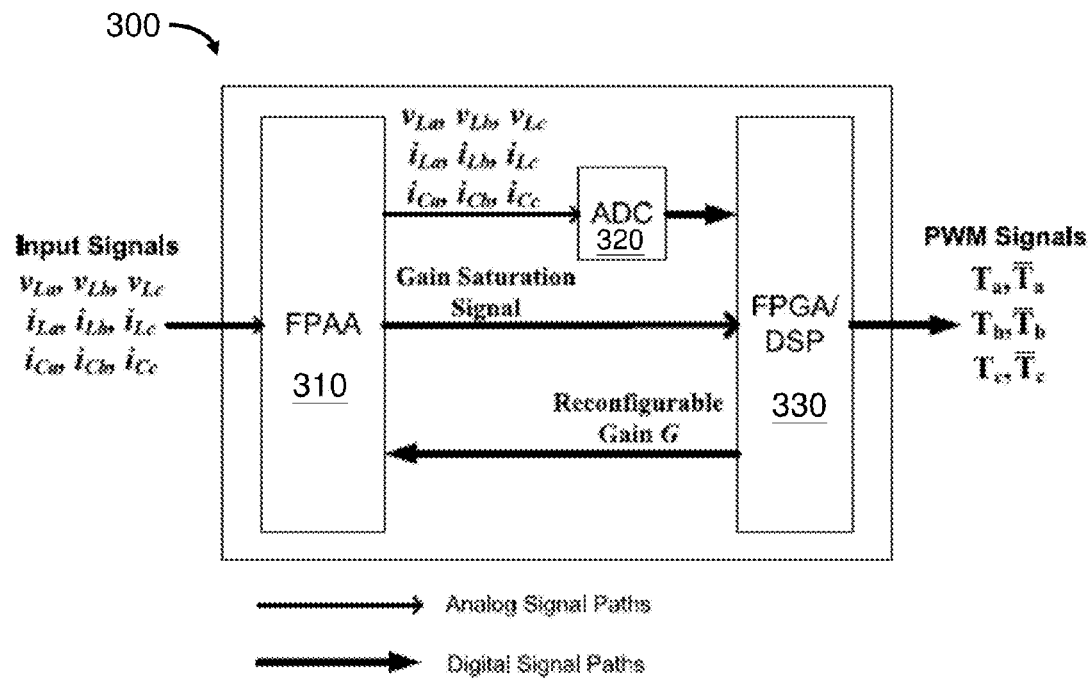
FIG. 3 shows a mixed signal controller in accordance with an example embodiment.

FIG. 3 shows a mixed signal controller 300 in accordance with an example embodiment. The mixed signal controller 300 includes a field programmable analog array (FPAA) 310, an analog-to-digital converter (ADC) 320 and a field programmable gate array/digital signal processor (FPGA/DSP) 330.

By way of example, input signals for the FPAA are analog signals from a power system and/or a power quality compensator. The output digital signals generated by the FPGA/DSP are pulse width modulation (PWM) trigger signals, which control switching devices of the power quality compensator.

In an example embodiment, The FPAA can be operated as an adaptive signal conditioning unit that preconditions and filters according to the optimization of system performance. The modified signals then pass to the digital units for further processing, assisted by the ADC. The digital unit, FPGA/DSP works with a subprogram to optimize the system operation by reconfiguring the control system automatically, or by self-testing and self-repairing. When it is necessary to reconfigure the analog part, the reprogramming data can be transferred directly through a digital path to the FPAA.

In another example embodiment, the FPAA communicates directly with the FPGA/DSP and sends out control signals to the FPGA to modify operation algorithms.

Figure 4:
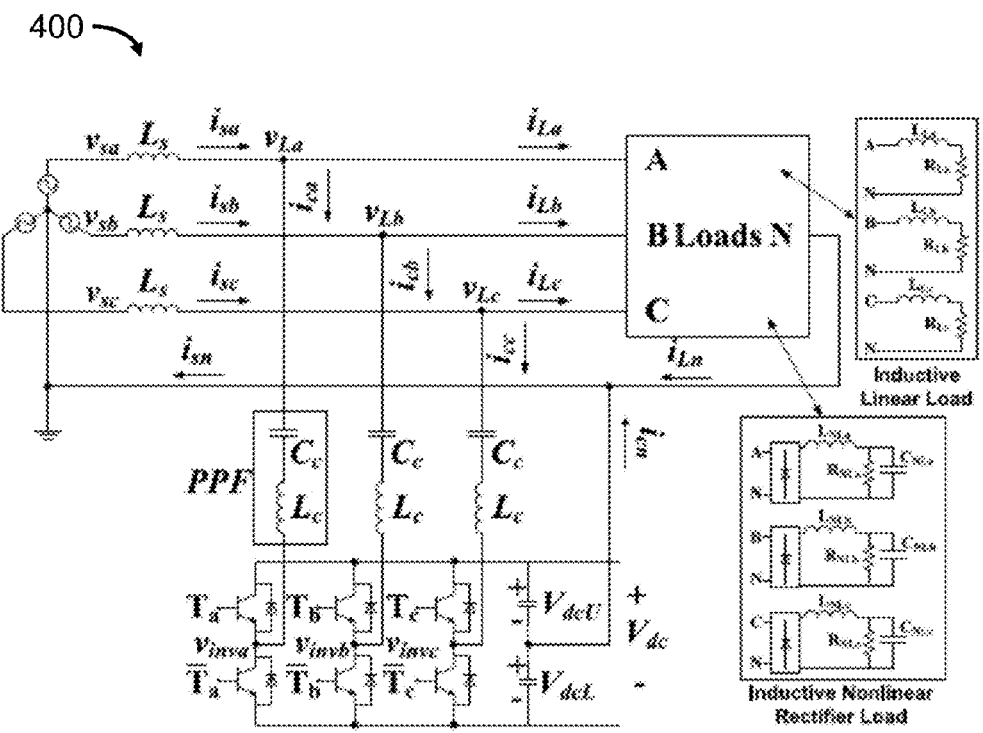
FIG. 4 shows a circuit diagram of a hybrid active power filter (HAPF) in accordance with an example embodiment.

FIG. 4 shows a circuit diagram of a hybrid active power filter (HAPF) 400 in accordance with an example embodiment. The power quality compensator 400 is a three-phase four-wire hybrid active power filter (HAPF) system. Various phases are denoted as a, b, c, and n. Vsa, Vsb and Vsc are system voltages at different phases. System current, load current, and inverter current are $i_s$, $i_L$, and $i_c$, respectively.

Exemplary self-reconfiguration control strategies for improving power quality compensator performance based on this HAPF system are discussed herein.

In one example embodiment, total harmonic distortion (THD) reflects a level of electrical noise generated by a power system and its ideal amount is 0%. It is given by the following equation:

$$THD = \frac{\sqrt{\sum_{n=2}^{\infty} I_n^2}}{I_1},$$

where the numerator is a sum of all harmonic currents, and the denominator $I_1$ is a fundamental current.

THD is used as an index to evaluate whether the power quality of a power supply is acceptable or not. However, the fundamental frequency current and its related harmonic components are defined and computed under root mean square (rms) values. It takes at least a period cycle of time to sample data for computation. For example, a 50-Hz system needs 0.02 s of cycle time.

Figure 5:
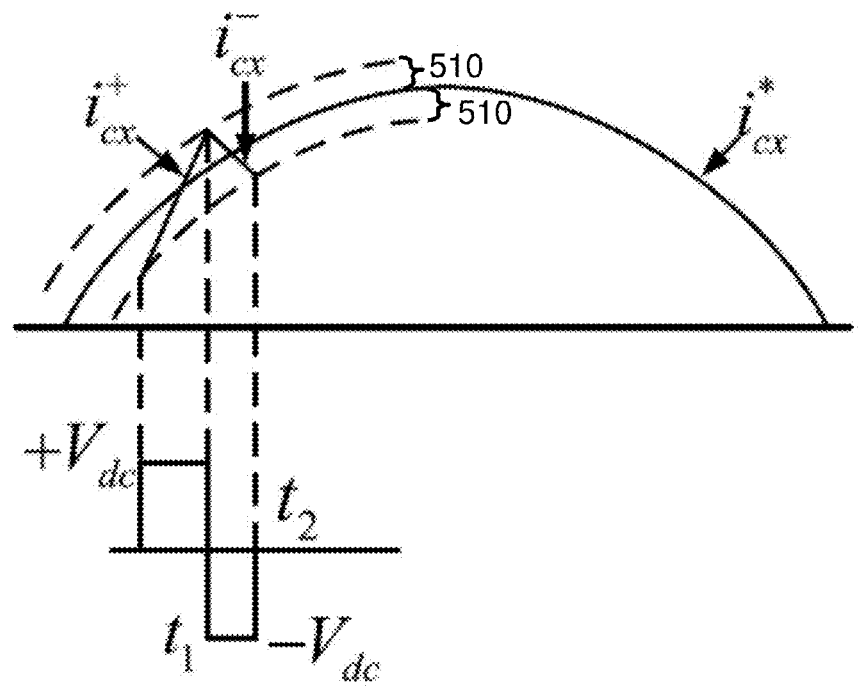
FIG. 5 shows a control method of a voltage source inverter by hysteresis pulse width modulation (PWM) in accordance with an example embodiment.

FIG. 5 shows a control method of a voltage source inverter by hysteresis pulse width modulation PWM in accordance with an example embodiment.

FIG. 5 illustrates the hysteresis current control of a voltage source PWM inverter, in which the sinusoidal reference current $i^*_{cx}$ is compared with the actual current $i_{cx}$. When the actual current is greater or less than the reference current by a hysteresis band (HB) 510, the inverter leg is switched on or off accordingly. Therefore, the HB 510 specifies the maximum current ripple.

Figure 6A:
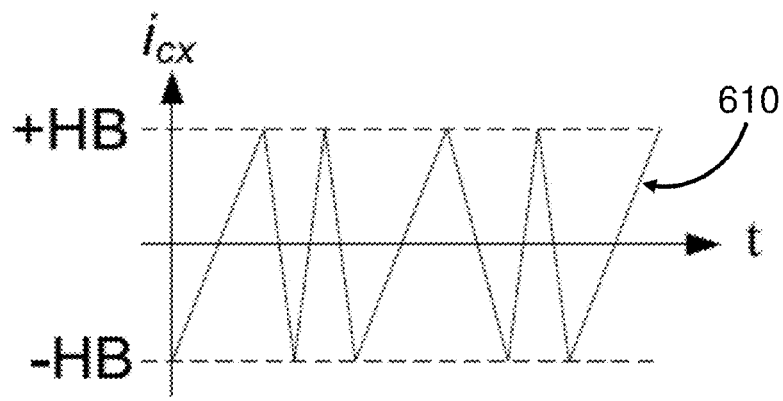
FIG. 6A shows a current error waveform of the voltage source inverter by hysteresis PWM in accordance with an example embodiment.

FIG. 6A shows a current error waveform 610 of the voltage source inverter by hysteresis PWM in accordance with an example embodiment. The X-axis shows time, and the Y-axis shows values of the actual current $i_{cx}$.

By way of example, the actual current $i_{cx}$ is decomposed into a sinusoidal current and an irregular triangular current waveform by superposition. After the superposition, the current error waveform 610 as shown in FIG. 6A has an irregular triangular shape, in which the rate of change of current at any moment is different, due to its different voltage amplitude at different times. Therefore, the triangular waveforms are not symmetrical.

Figure 6B:
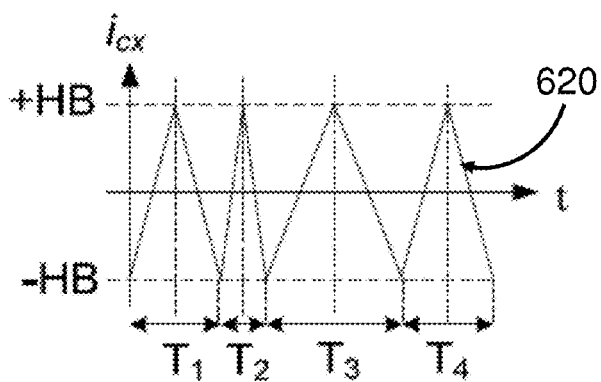
FIG. 6B shows an approximate current error waveform of the voltage source inverter by hysteresis PWM in accordance with an example embodiment.

FIG. 6B shows an approximate current error waveform 620 of the voltage source inverter by hysteresis PWM in accordance with an example embodiment. The X-axis shows time, and the Y-axis shows values of the actual current $i_{cx}$.

The ratio of the sum of all harmonic current components to the fundamental current component can be considered as the ratio of the rms value of the irregular triangular waveform to the fundamental sinusoidal waveform. However, by taking an approximation, the regular triangular waveform 620, as shown in FIG. 6B, is chosen instead of the irregular triangular waveform 610 as shown in FIG. 6A.

Further, FIG. 6B shows that each period of the triangular waveform is different. Correspondingly, the rms value of a regular triangular waveform is given by the following equation:

$$I_h = \sqrt{\frac{1}{T}\int_0^T \left[\frac{8 \cdot HB}{\pi^2}\sum_{n=1}^{\infty}\left(\frac{1}{n}\cos n\omega t\right)\right]^2 dt} = \frac{HB}{\sqrt{3}},$$

where the rms value is shown to be independent of the period of the triangular waveform. An approximate total harmonic distortion (ATHD) is then given by the following equation:

$$ATHD = \frac{HB}{\sqrt{3}\,I_1},$$

where $I_1$ is an rms current value hat has $\sqrt{2}$ difference with its peak value $I_{1p}$, and HB is a hysteresis band value that specifies a maximum variation of the current.

As one example, the instantaneous fundamental active current peak value can be calculated by the following equation:

$$I_{1p} = \frac{\sqrt{2} \cdot \bar{p}}{\sqrt{3}\,\|\Delta\|},$$

where $\|\Delta\| = \sqrt{v_a^2 + v_b^2 + v_c^2}$, and $$\bar{p} = \frac{1}{T}\int_0^T \vec{v} \cdot \vec{i}\, dt = \frac{1}{T}\int_0^T (v_a \cdot i_a + v_b \cdot i_b + v_c \cdot i_c)\, dt.$$

The approximate total harmonic distortion (ATHD) is then given by the following equation:

$$ATHD = \sqrt{\frac{2}{3}}\,\frac{HB}{I_{1p}},$$

where $I_{1p}$ is a peak value of a sinusoidal current which can be calculated instantaneously, and HB is a hysteresis band value that specifies a maximum variation of the current. ATHD is a fast evaluation index of compensation performance instead of THD, in which the HB of the ATHD can be determined according to hysteresis pulse width modulation (PWM) or the compensation error of space vector modulation.

By way of example, the ATHD is calculated during compensation, and as a result the fundamental reactive component is not considered in computing the ATHD value. The calculated ATHD would otherwise be smaller when the fundamental reactive current is included.

Simulated total harmonic distortion (THD) and approximate total harmonic distortion (ATHD) values are shown in table 700 of FIG. 7.

By way of example, table 700 shows the simulated THD and ATHD values with respect to the different fundamental current peak $I_{1p}$, in per unit (pu), and HB in pu at a sampling frequency of 5 KHz, and a system frequency of 50 Hz. For example, when $I_{1p}$=0.5 and HB=0.1, the simulation results show that THD is 16.08% and its ATHD is 16.33%.

Simulated absolute percentage error of ATHD compared with THD is shown in table 800 of FIG. 8.

By way of example, table 800 shows the simulated absolute percentage error of ATHD compared with THD calculated by the following equation:

$$|\Delta_{ATHD}| = \left|\frac{THD - ATHD}{THD}\right| \times 100\%.$$

The ATHD index is estimated to evaluate the compensation performance instantaneously. As shown in table 800, the absolute percentage error range of ATHD is shown to be from 0.06% to 14.5%, and its average percentage error is 3.44%. THD values that are close to or below 20% are highlighted underline in tables 700 and 800. The average percentage error of ATHD within 20% THD is 2.089%.

In one example embodiment, an ATHD at 16% is chosen when THD at 20% is the compensation target to include this average percentage error of ATHD.

The simulated results are estimated values and the values will be different in other example embodiments.

FIGS. 9-12 show simulated current waveforms at THD of 5%, 16%, 68%, and 124%, respectively. The X-axis shows time in seconds, and the Y-axis shows current values in amperes.

Figure 9:
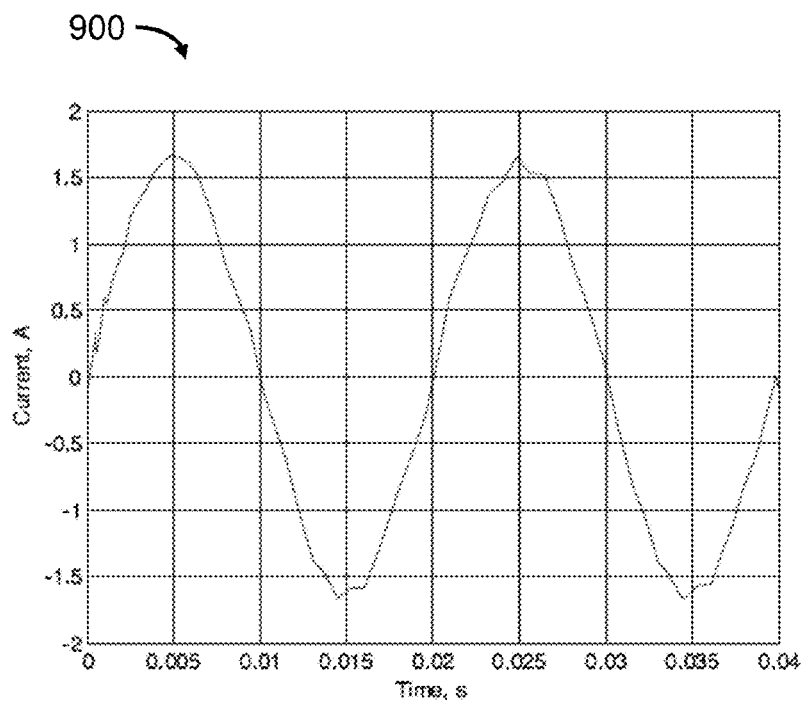
FIG. 9 shows a simulated current waveform at THD=4.92%, ATHD=5.1%, $|\Delta_{ATHD}|$=3.72% in accordance with an example embodiment.
Figure 10:
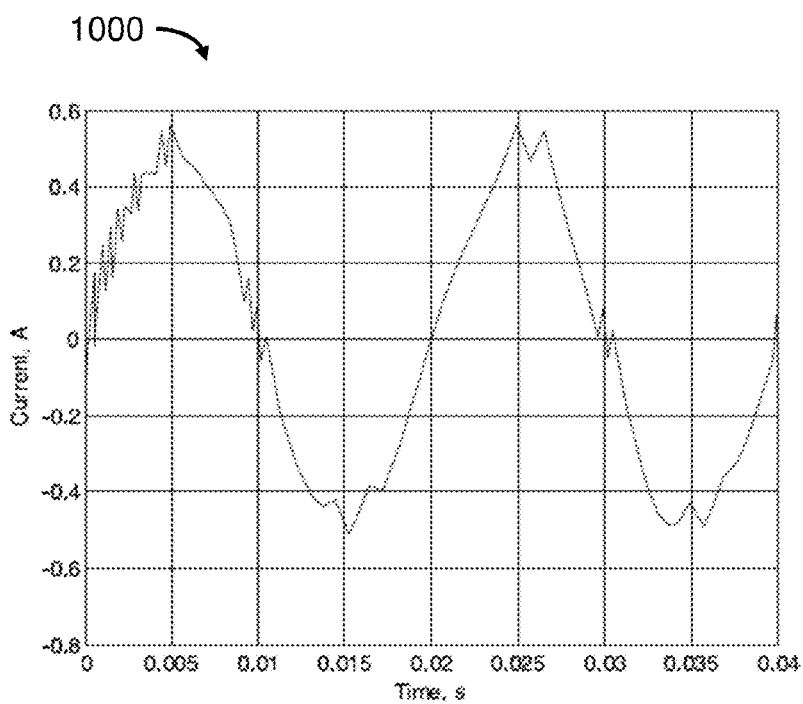
FIG. 10 shows a simulated current waveform at THD=16.08%, ATHD=16.33%, $|\Delta_{ATHD}|$=1.55% in accordance with an example embodiment.
Figure 11:
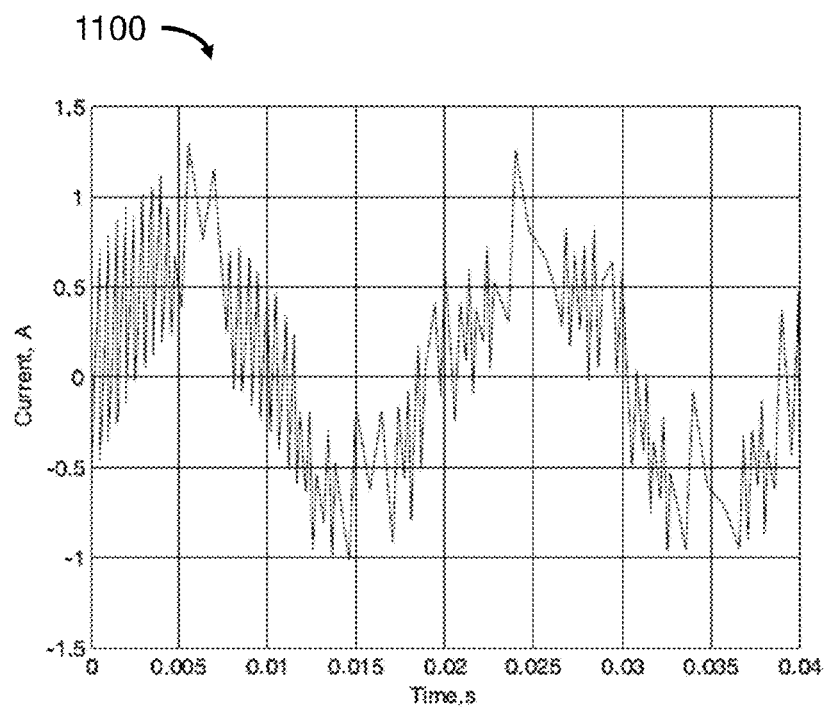
FIG. 11 shows a simulated current waveform at THD=67.56%, ATHD=69.99%, $|\Delta_{ATHD}|$=3.44% in accordance with an example embodiment.
Figure 12:
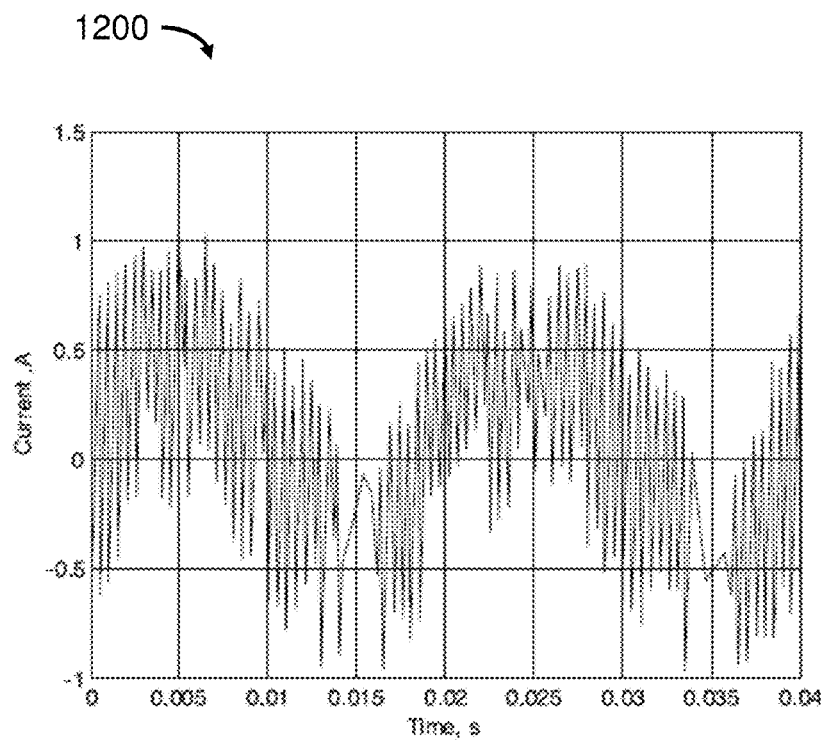
FIG. 12 shows a simulated current waveform at THD=124.8%, ATHD=142.9%, $|\Delta_{ATHD}|$=14.5% in accordance with an example embodiment.

FIG. 9 shows the waveform 900 at THD of around 5% with |ΔATHD|=3.72%, corresponding to $I_{1p}$=1.6 A and HB=0.1 A. FIG. 10 shows the waveform 1000 at THD of around 16% with |ΔATHD|=1.55%, corresponding to $I_{1p}$=0.5 A and HB=0.1 A. FIG. 11 shows the waveform at THD of around 68% with average |ΔATHD|=3.44%, corresponding to $I_{1p}$=0.7 A and HB=0.6 A. FIG. 12 shows the waveform at THD of around 124% with the largest |ΔATHD|=14.5%, corresponding to $I_{1p}$=0.4 A and HB=0.7 A.

By way of example, at THD of around 16%, based on table 700 of FIG. 7, the hysteresis error band HB should be set as one-fifth of the fundamental amplitude. Furthermore, a parameter $K=I_1/HB$ is defined as a ratio of the fundamental rms current amplitude to the hysteresis error band value. When K increases, the compensated current ripple relatively decreases.

FIG. 13 shows simulated THD 1310 and ATHD 1320 in accordance with an example embodiment. The X-axis is K values, and the Y-axis shows a ratio of the simulated THD to the ATHD. With respect to K, the difference between THD and ATHD is small.

Simulated and experimental system parameters are shown in table 1400 of FIG. 14.

By way of example, the simulation shown in FIG. 13 takes the system parameters listed in table 1400 under 50% loading compensation. The THD standard of 20% is selected, as discussed, while the ATHD of 16% for the percentage error and safety margin considerations is selected.

It is shown in FIG. 13 that K is around 3.8 at ATHD of around 16%, which corresponds to $I_{1p}$=0.5 A, HB=0.1 A, and THD=16.08% in table 700. $I_{1p}$ is the fundamental current peak value. As one example, the HB value or error margin of the hysteresis PWM control should not be less than 0.26 times the fundamental rms current amplitude.

The ATHD as discussed herein is an approximated performance index that rapidly determines the THD value and that estimates the power quality compensation system performance of active power filters (APFs) and/or hybrid active power filters (HAPFs). The advantages of using an ATHD over THD are: 1) It can simplify the computation without computation of the frequency spectrum; 2) The ATHD value can be obtained in real time; 3) Hardware implementation of ATHD is simplified.

Figure 15:
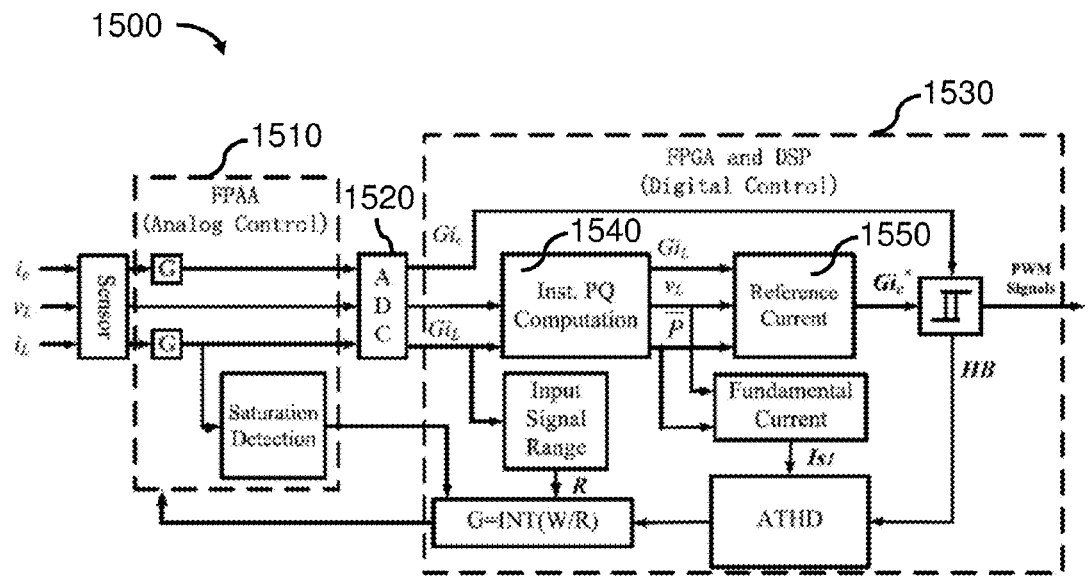
FIG. 15 shows a mixed signal controller in accordance with another example embodiment.

FIG. 15 shows a mixed signal controller 1500 in accordance with another example embodiment. The mixed signal controller 1500 includes a field programmable analog array (FPAA) 1510, an analog-to-digital converter (ADC) 1520 and a field programmable gate array/digital signal processor (FPGA/DSP) 1530.

By way of example, input signals are $i_c$, $v_L$ and $i_L$, which are inverter current, load voltage, and load current, respectively. The FPAA 1510 amplifies the input signals by a gain factor (G) and sends the amplified analog signals to the ADC 1520. The FPGA/DSP 1530 receives digital signals from the ADC, calculates the reference compensating current of each phase and then generates pulse width modulation (PWM) trigger signals to control switching devices in a power quality compensator.

As an example, the FPAA 1510 is an analog control part in which G is the amplified analog signal which is calculated in the FPGA/DSP 1530. The FPGA/DSP calculates and determines if the ATHD value of the compensator can fulfill the requirement of the THD standard. If not, the amplification of the analog input signal before the ADC will be taken to enhance the compensation performance. The amplifying gain G will be calculated by diving the range of ADC and the range of peak-to-peak input signal. Then this gain signal calculated by the FPGA/DSP is sent to analog circuit to implement the signal amplification. If the input signal is larger than the input range of the ADC, then G=1. If the input is not larger than the input range of the ADC, then G is determined by:

$$G = INT\left(\frac{W}{R}\right),$$

where INT is an integer function that takes out all the fraction parts, W is a measured width (range) of the ADC, and R is a peak-to-peak input signal range for a given period.

In an example embodiment, block 1540 in the FPGA/DSP 1530 calculates the average active power ($\vec{p}$) by:

$$\bar{p} = \frac{1}{T}\int_0^T \vec{v}\cdot\vec{i}\,dt = \frac{1}{T}\int_0^T (v_a \cdot Gi_{La} + v_b \cdot Gi_{Lb} + v_c \cdot Gi_{Lc})\,dt.$$

Block 1550 in the FPGA/DSP 1530 calculates the reference current by:

$$Gi_{cx}^* = \left(Gi_{La} - \frac{\bar{p}}{v^2}v_{La}\right)\vec{n_a} + \left(Gi_{Lb} - \frac{\bar{p}}{v^2}v_{Lb}\right)\vec{n_b} + \left(Gi_{Lc} - \frac{\bar{p}}{v^2}v_{Lc}\right)\vec{n_c}.$$

Then, its fundamental current can be computed instantaneously by:

$$I_{1p} = \frac{\sqrt{2}\cdot\bar{p}}{\sqrt{3}\,\|\Delta\|},$$

where $\|\Delta\|=\sqrt{v_a^2+v_b^2+v_c^2}$.

The mixed signal controller 1500 has self-reconfiguration capabilities that improve the performance of the power quality compensator. By way of example, the reference compensating current $i^*_{cx}$ for a HAPF shown in FIG. 4 is given by the following equation:

$$i^*_{cx} = \left(i_{La} - \frac{\bar{p}}{v^2}v_{La}\right)\vec{n_a} + \left(i_{Lb} - \frac{\bar{p}}{v^2}v_{Lb}\right)\vec{n_b} + \left(i_{Lc} - \frac{\bar{p}}{v^2}v_{Lc}\right)\vec{n_c},$$

where $\{\vec{n_a},\vec{n_b},\vec{n_c}\}$ is the space basis in the a-b-c coordinate, $p=v_{La}i_{La}+v_{Lb}i_{Lb}+v_{Lc}i_{Lc}$, and $\bar{p}$ is an average value of the instantaneous power p.

Under perfect compensation, the actual compensator current $i^*_{cx}$ should be the same as its reference current $i^*_{cx}$. The subscript "x" denotes phases a, b and c. The source current $i_{sx}$, composed of load current and compensator current is given by the following equations:

$$i_{sx} = i_{Lx} + i^*_{cx} \cong i_{sx1} \text{ and}$$

$$i_{sx1} \cong i_{Lx} + i_{cx} + HB,$$

where HB is a hysteresis band (HB) value that specifies a maximum variation of the compensator current.

In one example embodiment, the resolution of HB is limited by the available bits (B) of the ADC, and the amplitude width (W) of the input signal. The minimum HB value is given by the following equations:

$$HB_{min} = \frac{W}{2^{B+1}},$$

where $HB_{min}$ is the minimum value of HB and cannot be further reduced due to the hardware limitations of the controller. When the amplitude of HB is relatively near to the amplitude of $i_{Lx}$ and $i_{cx}$, the compensation performance may not be acceptable. This is because the $HB_{min}$ cannot be further reduced. The gain factor G is attached to K and the K value can be adjusted to a larger value to decrease THD and ATHD, as shown in the following equations:

$$K = G \cdot \frac{i_{sx1}}{HB} \cong G \cdot \left(1 + \frac{i_{Lx} + i_{cx}}{HB}\right) \text{ and}$$

$$G = INT\left(\frac{W}{R}\right),$$

where INT is an integer function that takes out all the fraction parts, W is the measured width (range) of the ADC, and R is the peak-to-peak input signal range for a given period, for example, 1 min or several hours, to avoid system fluctuation during operations.

As an example, the gain factor (G) is calculated by the DSP/FPGA, and then sent to the FPAA for gain modification. During light loading, G is an integer number larger than 1.

The gain factor G improves the compensation performance of the system. As one example, when the ATHD is around 16%, K≈3.8 according to FIG. 13 when there is no gain (G=1). As another example, when the ATHD is around 20%, K≈3 according to FIG. 13 when there is no gain, but ATHD can be reduced to around 10% if G is set to 2, which leads to K≈6.

In an example embodiment, a saturation detection function is implemented in FPAA to avoid analog signal saturation. The gain factor G is adjusted to 1 by the FPAA when saturation occurs.

In another example embodiment, a compensation error ($\Delta i_{error}$) is given by the following equation:

$$\Delta i_{error} = HB_{min} = G \cdot i^*_{cx} - G \cdot i_{cx}.$$

Figure 16:
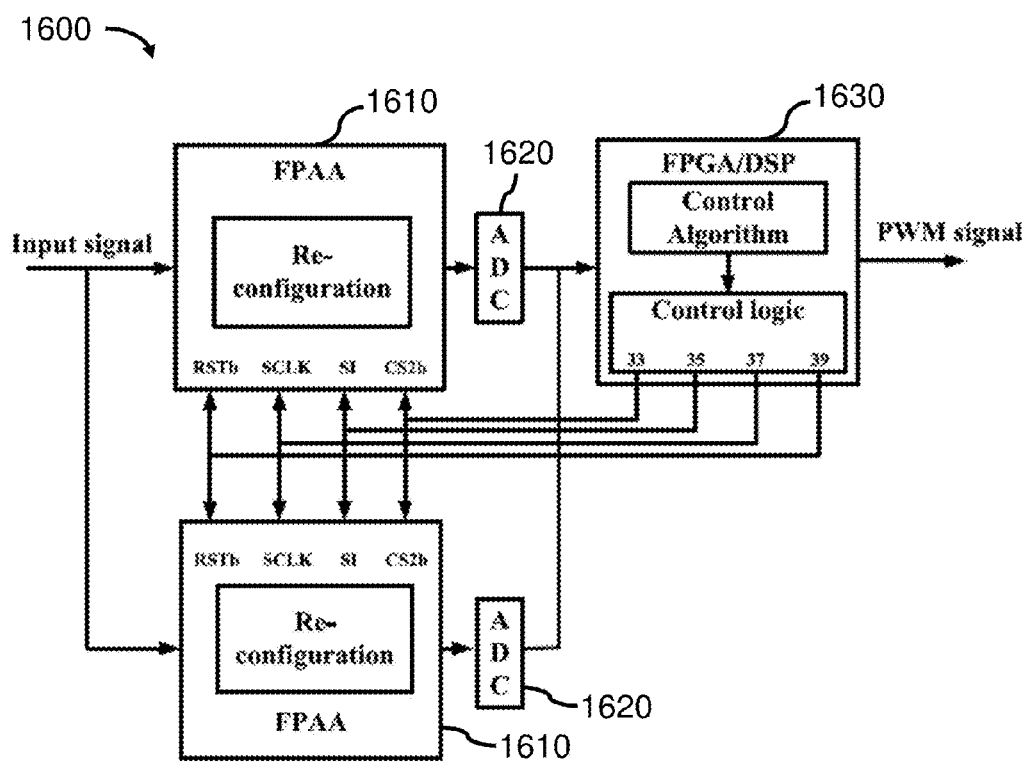
FIG. 16 shows a connection configuration of a mixed signal controller in accordance with another example embodiment.

FIG. 16 shows a connection configuration of a mixed signal controller 1600 in accordance with another example embodiment. The mixed signal controller includes two field programmable analog arrays (FPAAs) 1610, two analog-to-digital converters (ADCs) 1620 and a field programmable gate array/digital signal processor (FPGA/DSP) 1630. The mixed signal controller 1600 reconfigures itself to adjust the gain automatically and rapidly, which further improve the compensation performance of the system.

By way of example, the FPAAs 1610 are controlled by the FPGA 1630. The inherent reconfigurable properties of FPAAs allow the analog modules to be dynamically reconfigured through a serial interfaces. During system initialization, voltage and current signals are detected and amplified by the FPAA by a gain factor, digitized through an ADC, and fed into the FPGA for further processing. The gain factor is controlled by the FPGA. The output voltage limit is 3 V, which is the maximum input voltage for the ADC. If the input signal amplified by the FPAA is saturated, the FPGA will reset the gain factor to 1. Through various computations and comparisons, the corresponding value of the gain factor for the FPGA will be obtained.

As an example, the mixed signal controller improves power compensation quality with adaptive gain, on-the-fly programmability and self-reconfiguration properties in a three-phase four-wire HAPF system. An ATHD is calculated in real time to detect the compensation performance instantaneously. Gains are calculated in the FPGA and transferred by a feedback loop to the FPAA in a dynamic configuration process.

Figure 17:
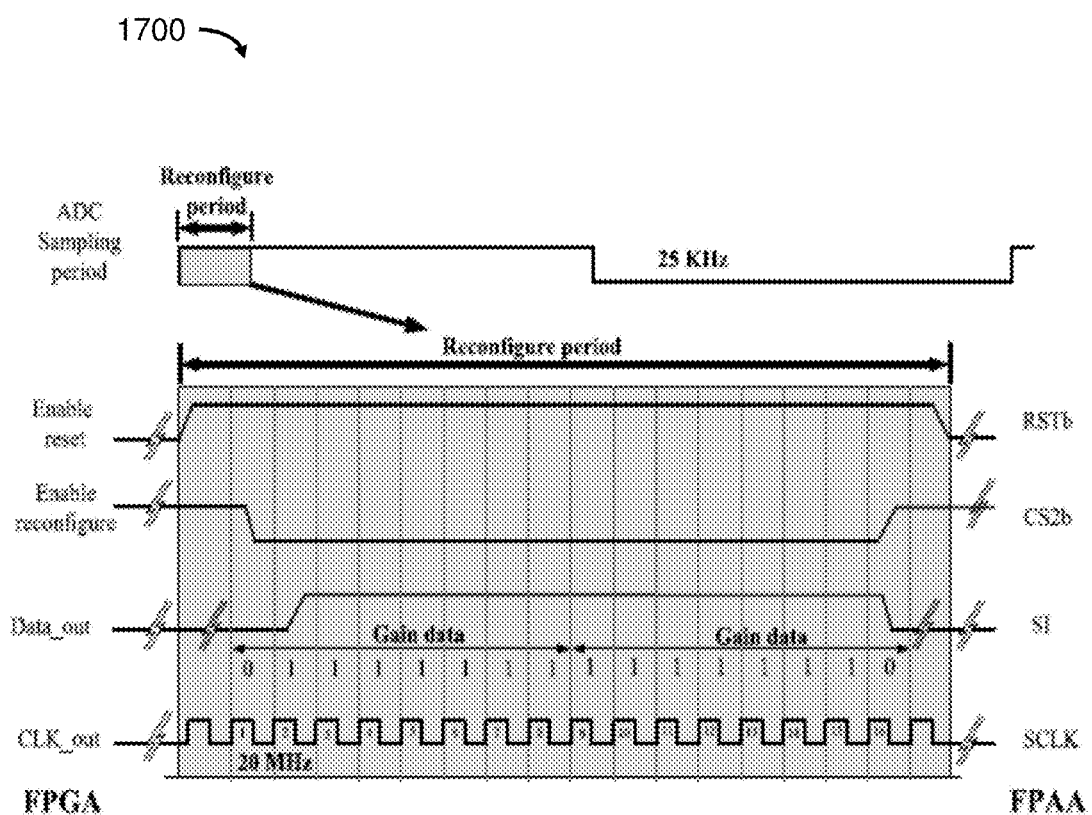
FIG. 17 shows a data stream of a mixed signal controller in accordance with another example embodiment.

FIG. 17 shows a data stream 1700 of a mixed signal controller in accordance with another example embodiment.

As one example, the configuration clock of the FPAA and FPGA is 20 megahertz (MHz). In the configuration process, every gain value needs 11 bytes of control logic data, defined by the configuration protocol in the FPAA.

Each byte has one 8-bit address, which in total needs $t_1$ (second) to completely transmit. The sampling frequency of the whole controller is 25 kHz, so the controller outputs obtained in this period is ½₅ kHz (40 µs). In total, the control loop, including the analog to digital conversion, power quality theory, PWM techniques, and feedback loop, can be completed in one ADC sample period. Moreover, $t_1$, as given in the following equation, is much smaller than one ADC sampling cycle, which means the compensation control algorithm will not be affected by the on-the-fly FPAA reconfiguration.

$$t_1 = 11 \times 8 \times \frac{1}{20 \times 10^6} = 4.4 \times 10^{-6} s \ll \frac{1}{25 \times 10^3} = 4 \times 10^{-5} s.$$

Example embodiments are provided below to show power quality compensator performance compared with a conventional digital controller, in which a three-phase four-wire HAPF system as shown in FIG. 4 is chosen as the power quality compensator. Table 1400 of FIG. 14 lists the simulated and experimental system parameters for the HAPF with different loadings.

Figure 18:
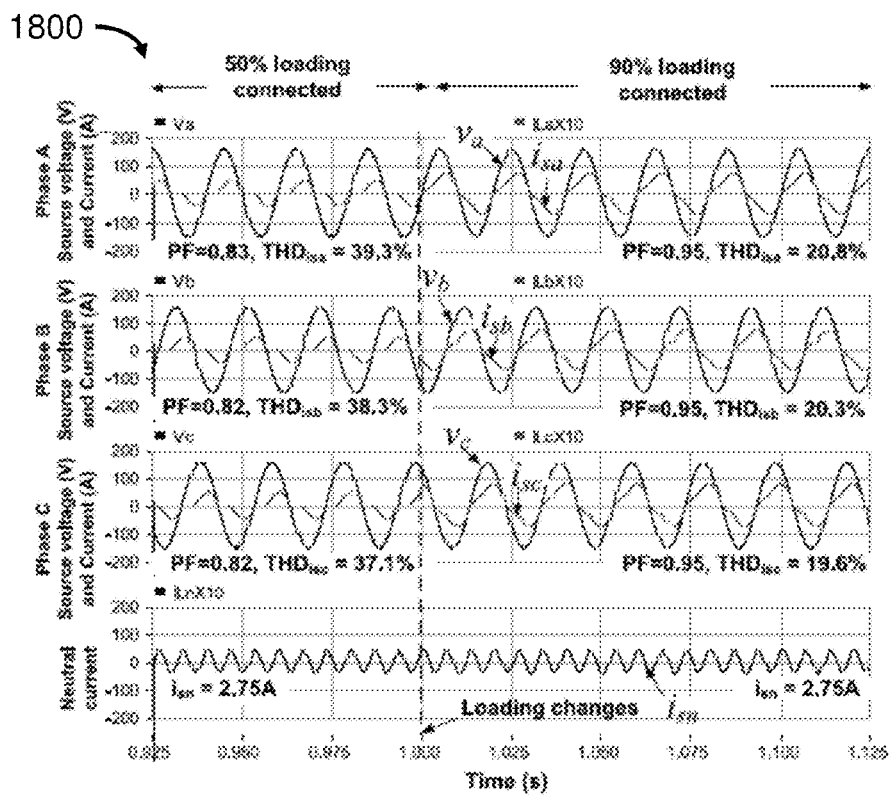
FIG. 18 shows a graph of a simulated voltage and current of a system before compensation in accordance with an example embodiment.

FIG. 18 shows a graph 1800 of a simulated voltage and current of a system before compensation in accordance with an example embodiment. The X-axis shows time in seconds, and the Y-axis shows voltage in volts and current in amperes.

As one example, when 50% loading is connected, the three-phase simulated THD of the system current ($THD_{isa}$, $THD_{isb}$ and $THD_{isc}$) are 39.3%, 38.3%, and 37.1%, with a power factor (PF) of 0.83, 0.82, and 0.82, respectively. When 90% loading is connected (loading compensation, by applying the conventional digital changes), the three-phase simulated are 20.8%, 20.3%, and 19.6%, with PF of 0.95, 0.95, and 0.95, respectively. The above simulated THD values do need satisfy the requirement of less than 20% under both 50% and 90% loading conditions before compensation.

Figure 19:
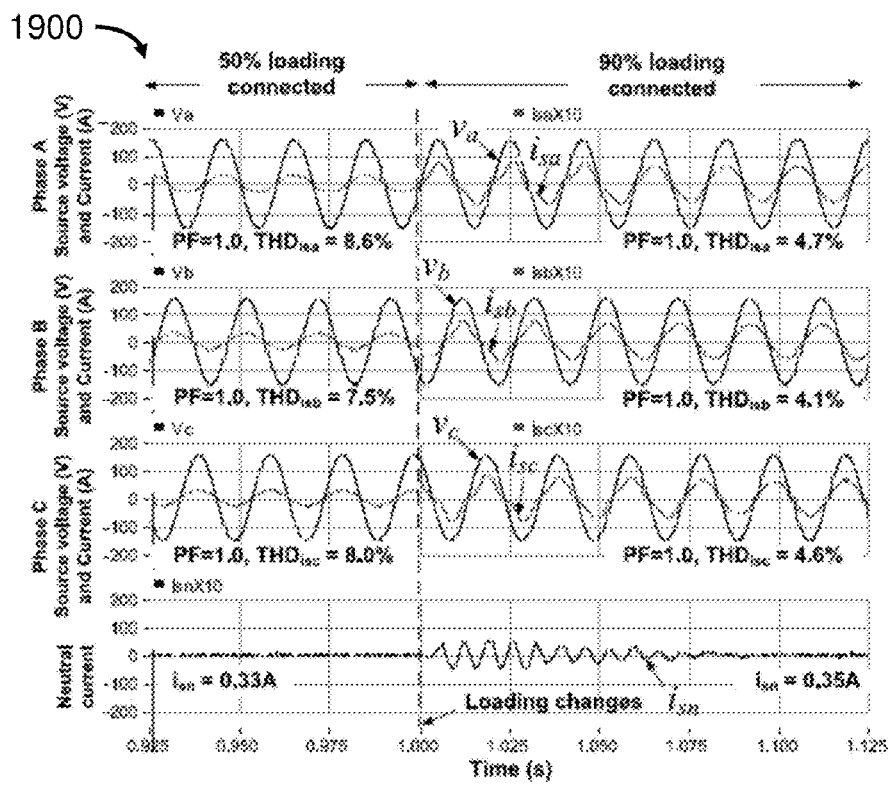
FIG. 19 shows a graph of a simulated voltage and current of the system after HAPF compensation in accordance with an example embodiment.
Figure 20A:
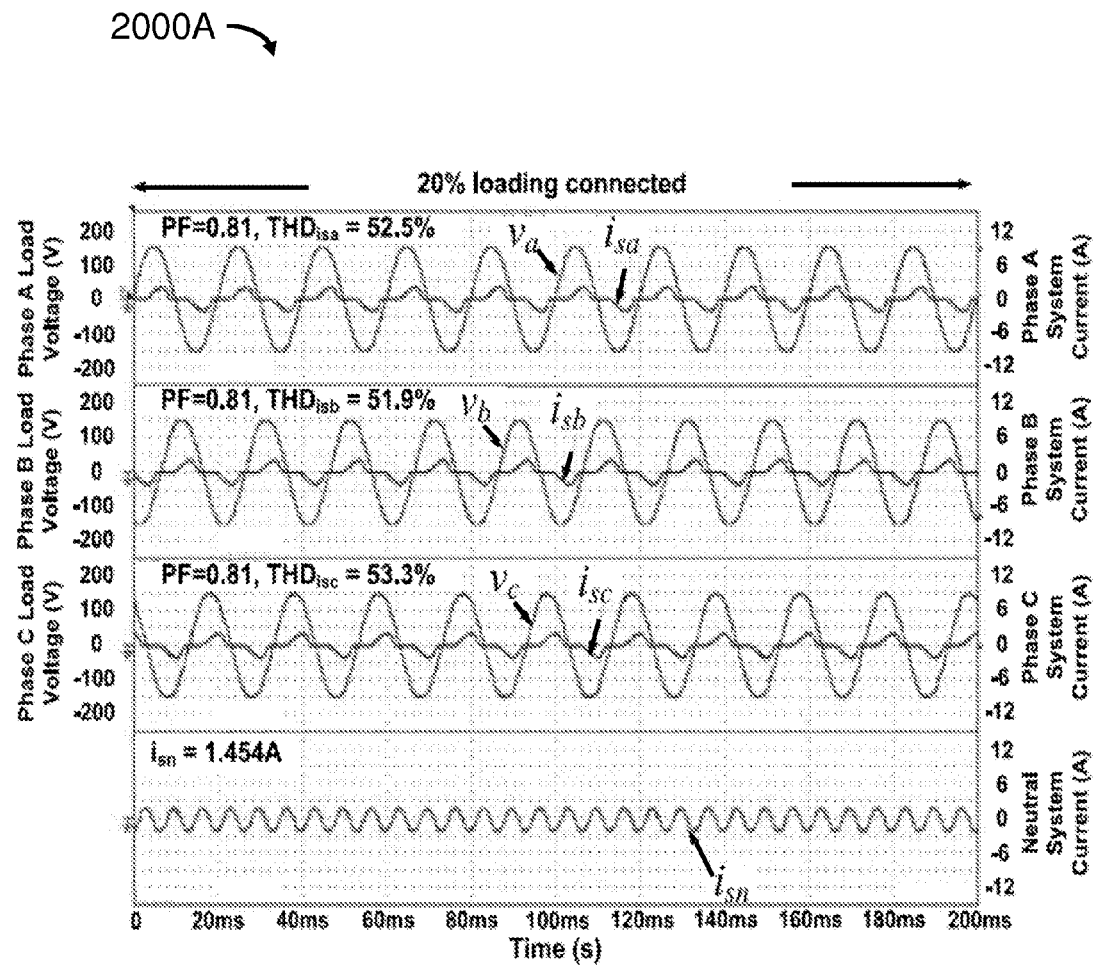
FIG. 20A shows a graph of a voltage and current of a three-phase power system before compensation at 20% loading in accordance with an example embodiment.
Figure 20B:
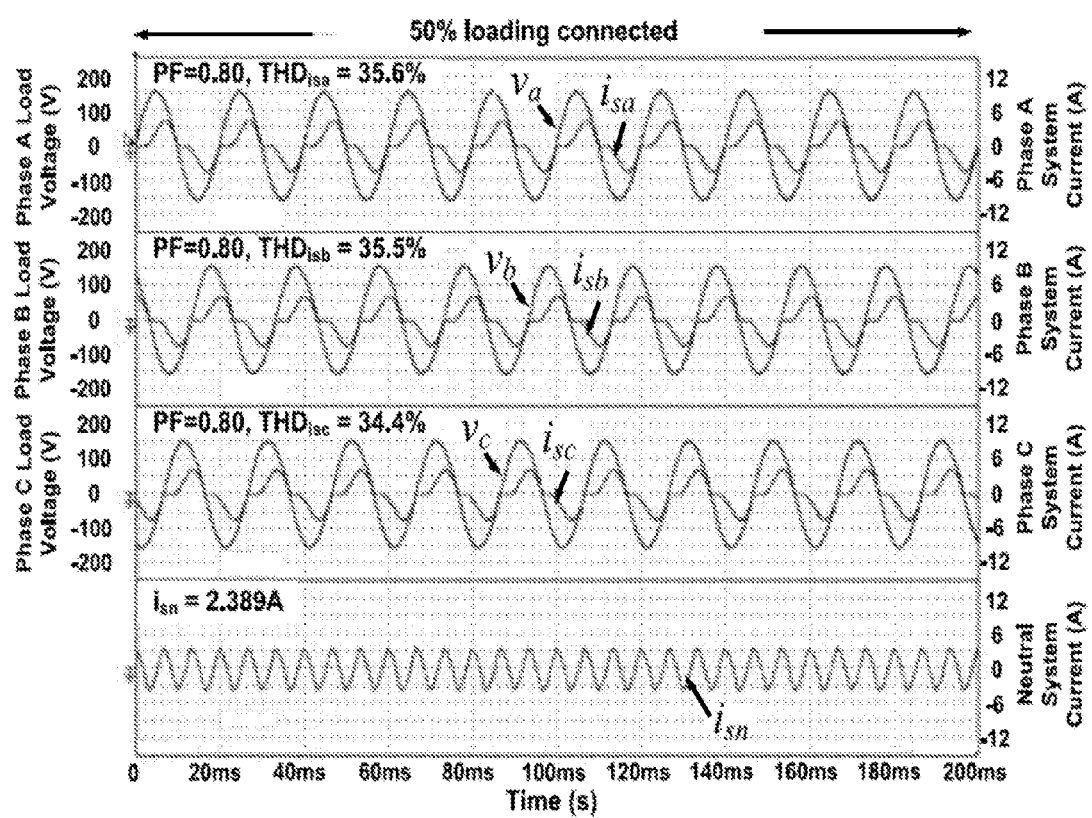
FIG. 20B shows a graph of a voltage and current of a three-phase power system before compensation at 50% loading in accordance with an example embodiment.
Figure 20C:
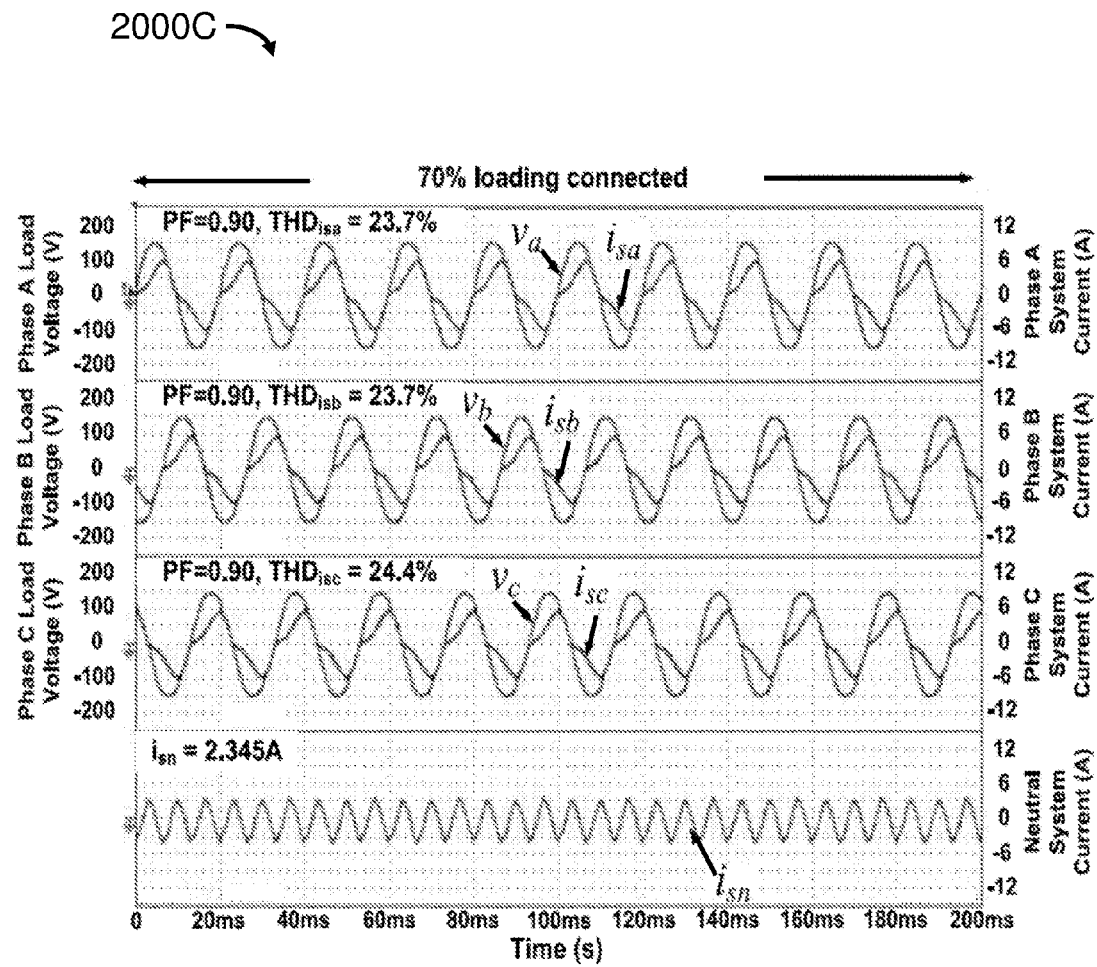
FIG. 20C shows a graph of a voltage and current of a three-phase power system before compensation at 70% loading in accordance with an example embodiment.
Figure 20D:
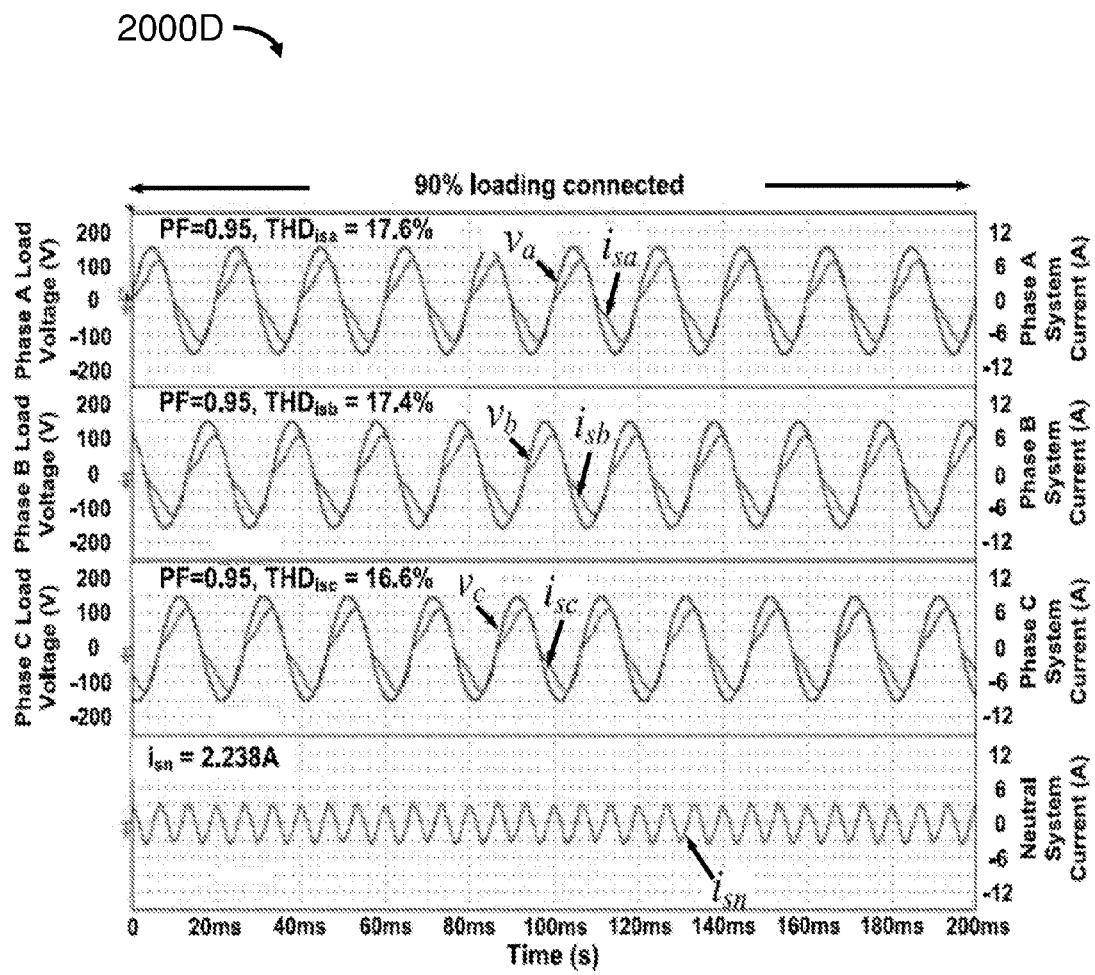
FIG. 20D shows a graph of a voltage and current of a three-phase power system before compensation at 90% loading in accordance with an example embodiment.
Figure 21A:
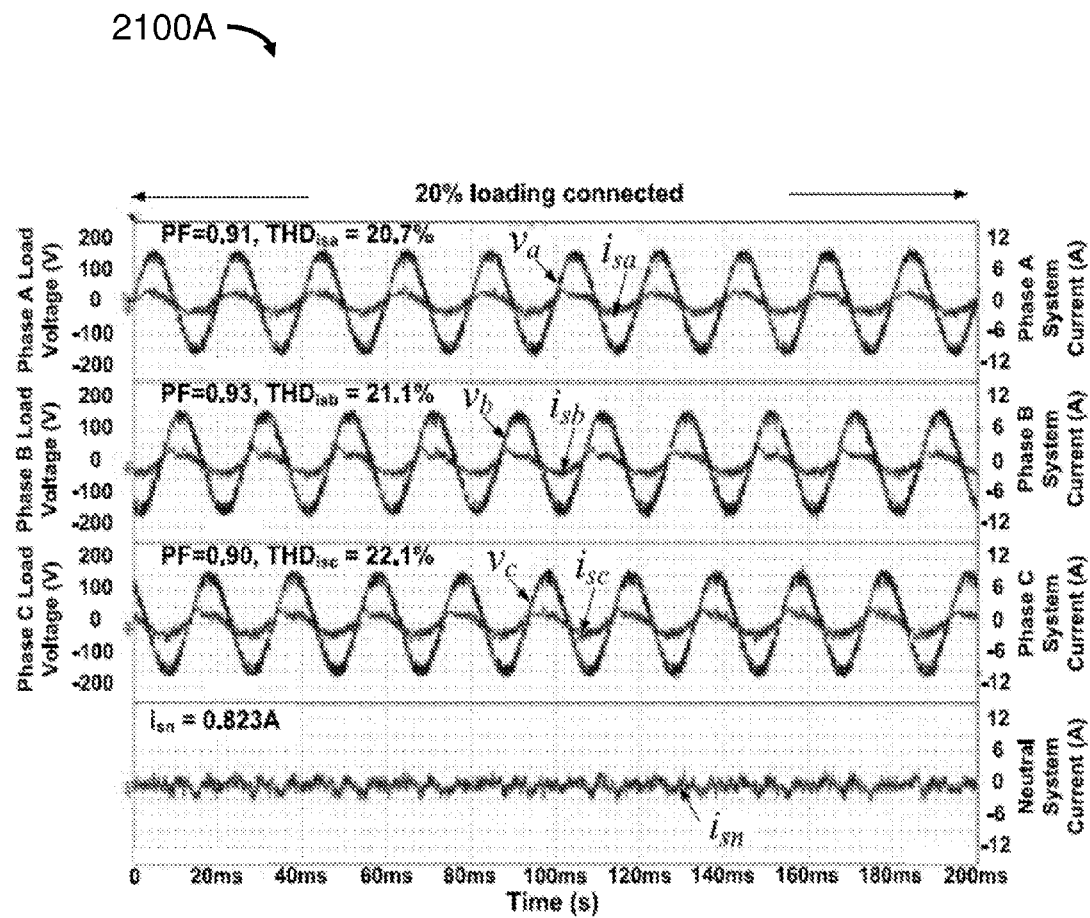
FIG. 21A shows a graph of a voltage and current of a three-phase power system after HAPF compensation with a digital controller at 20% loading in accordance with an example embodiment.
Figure 21B:
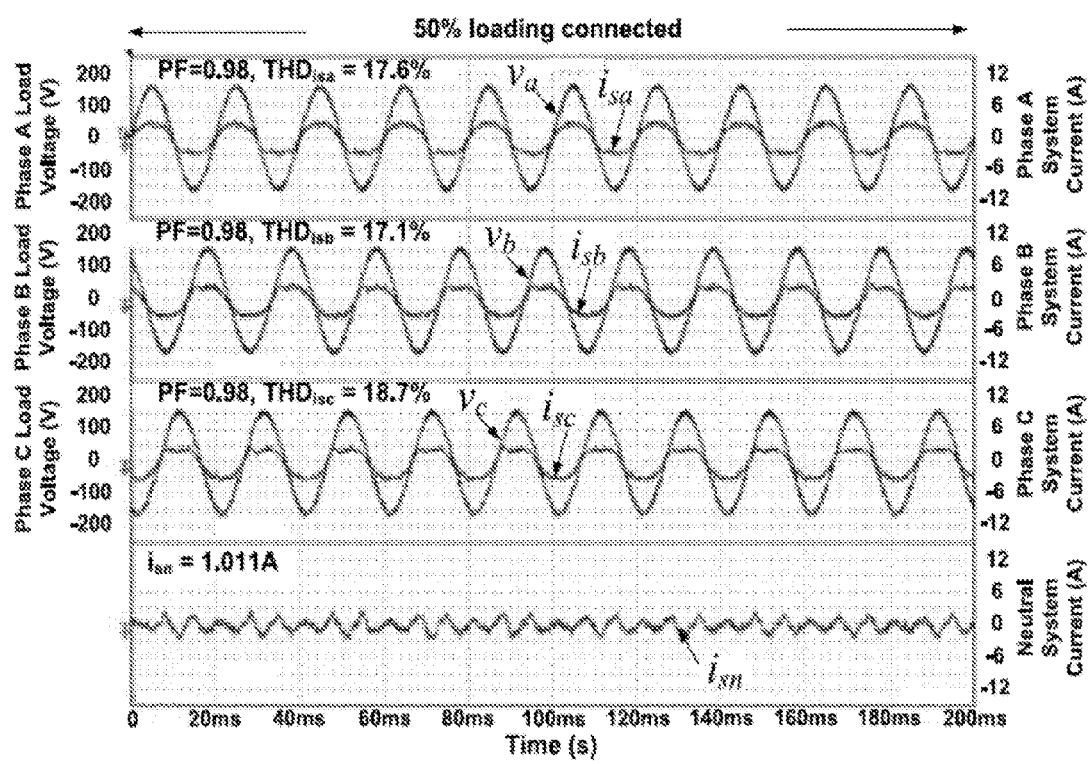
FIG. 21B shows a graph of a voltage and current of a three-phase power system after HAPF compensation with a digital controller at 50% loading in accordance with an example embodiment.
Figure 21C:
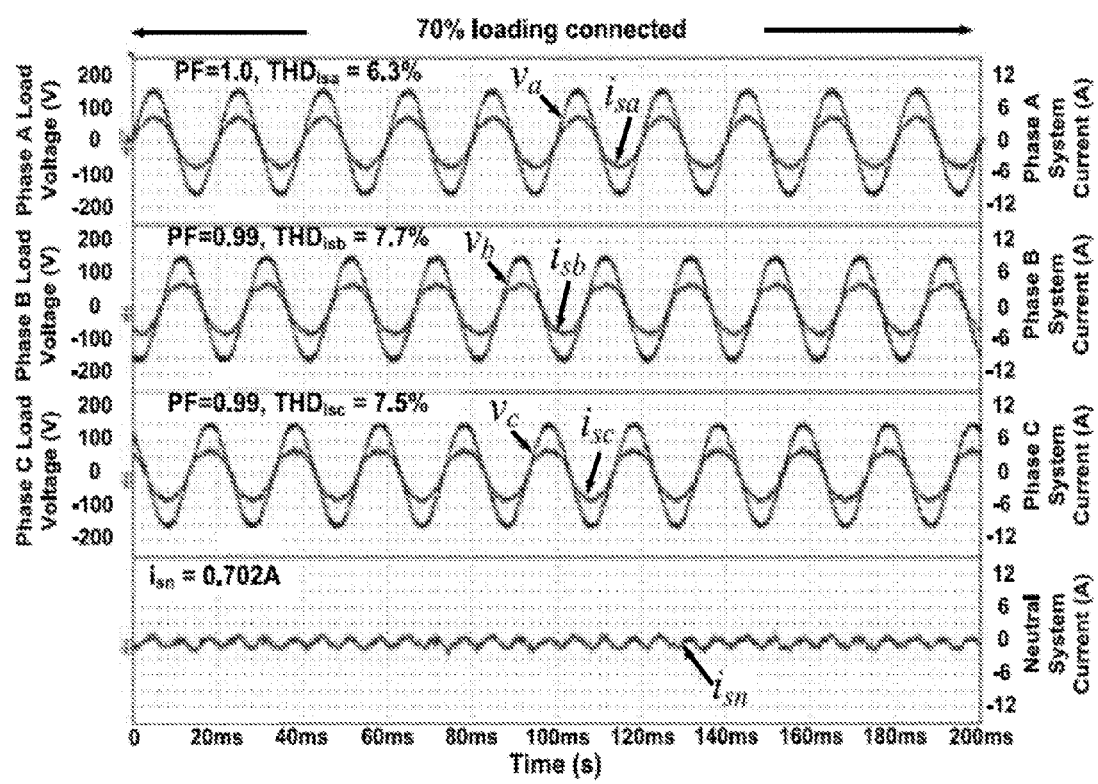
FIG. 21C shows a graph of a voltage and current of a three-phase power system after HAPF compensation with a digital controller at 70% loading in accordance with an example embodiment.
Figure 21D:
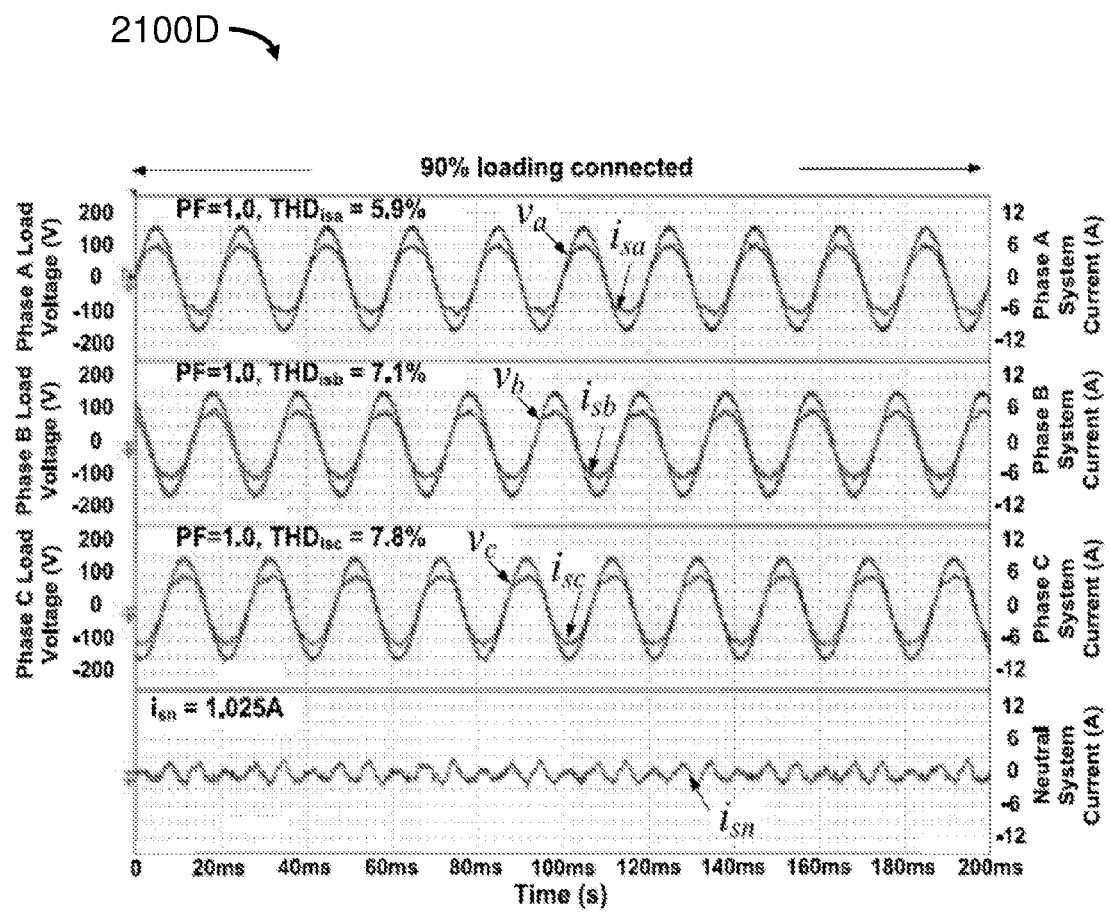
FIG. 21D shows a graph of a voltage and current of a three-phase power system after HAPF compensation with a digital controller at 90% loading in accordance with an example embodiment.
Figure 22A:
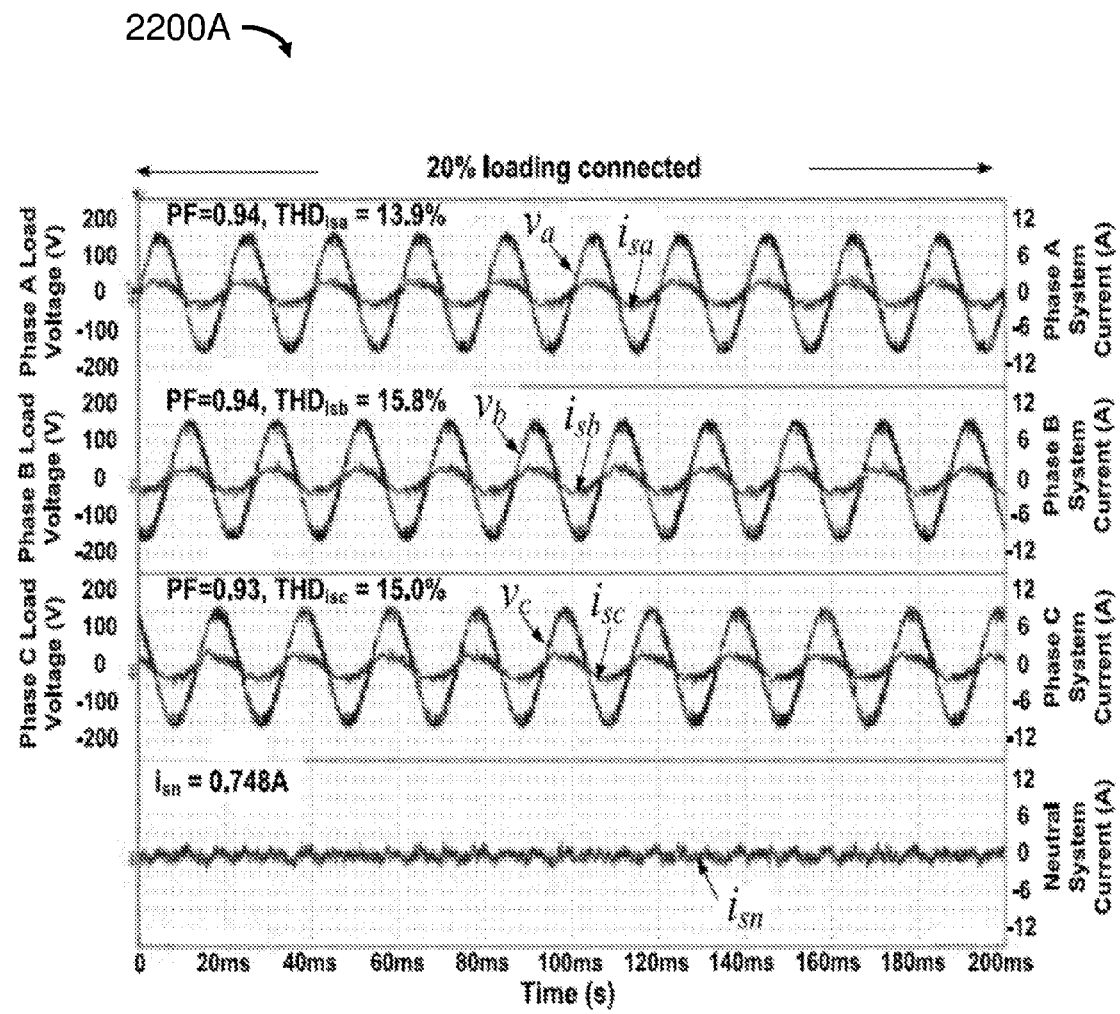
FIG. 22A shows a graph of a voltage and current of a three-phase power system after HAPF compensation with a mixed signal controller at 20% loading in accordance with an example embodiment.
Figure 22B:
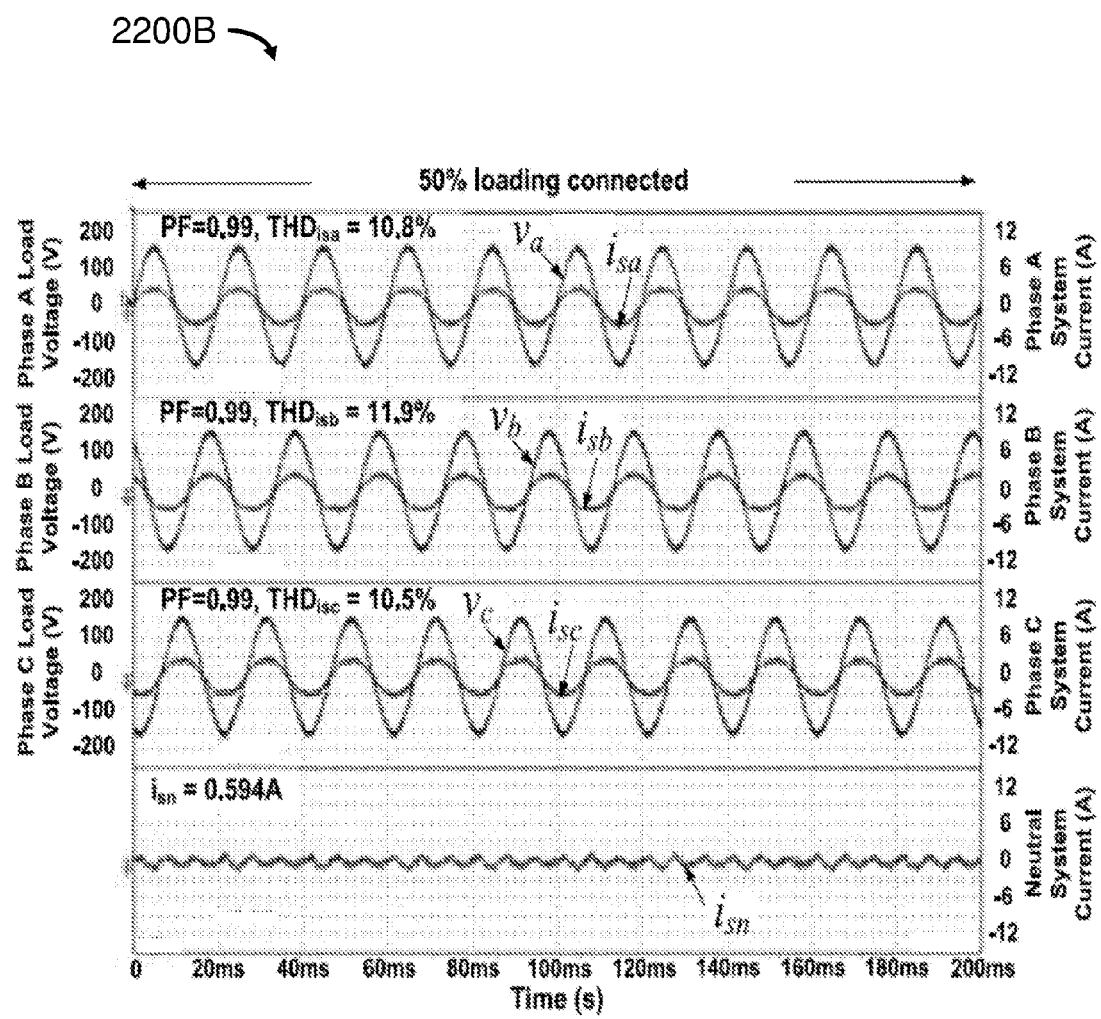
FIG. 22B shows a graph of a voltage and current of a three-phase power system after HAPF compensation with a mixed signal controller at 50% loading in accordance with an example embodiment.
Figure 22C:
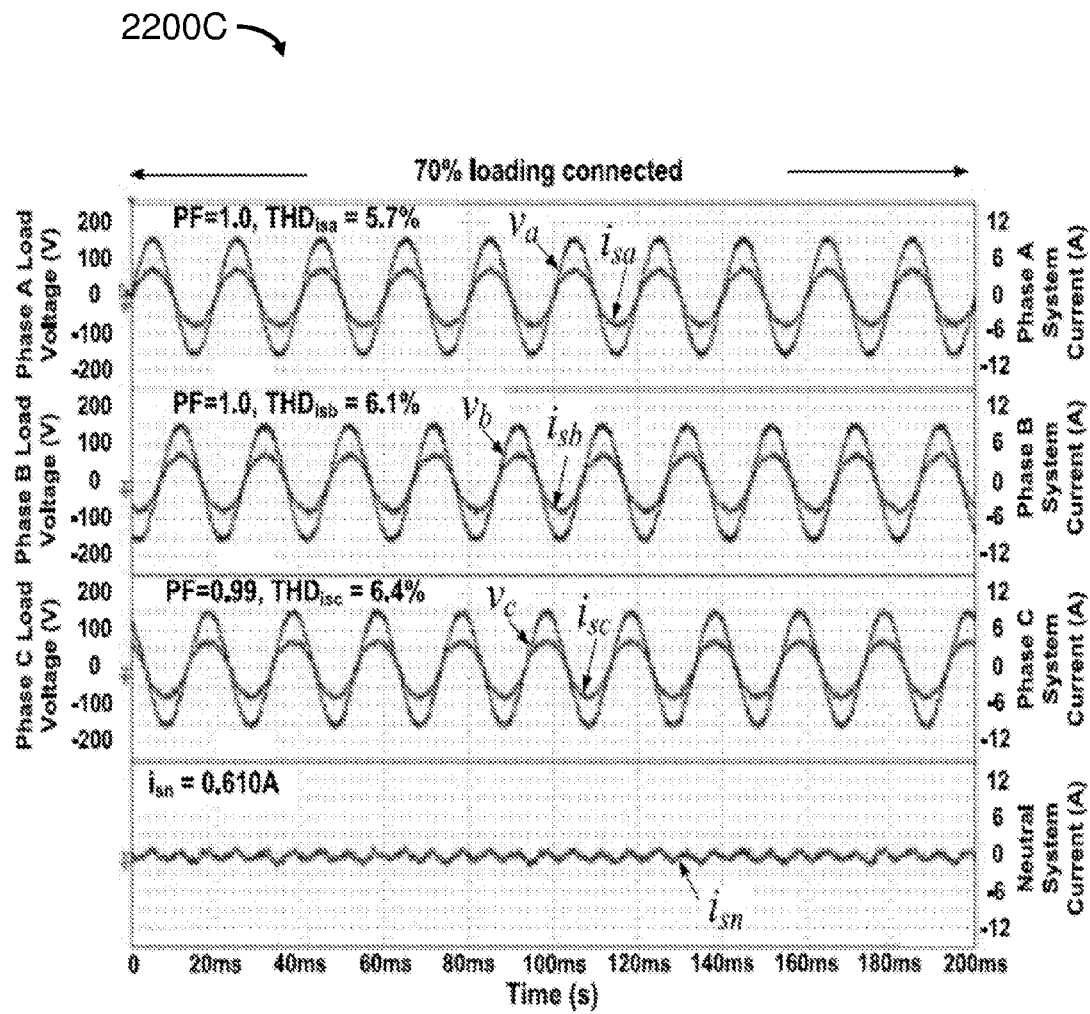
FIG. 22C shows a graph of a voltage and current of a three-phase power system after HAPF compensation with a mixed signal controller at 70% loading in accordance with an example embodiment.
Figure 22D:
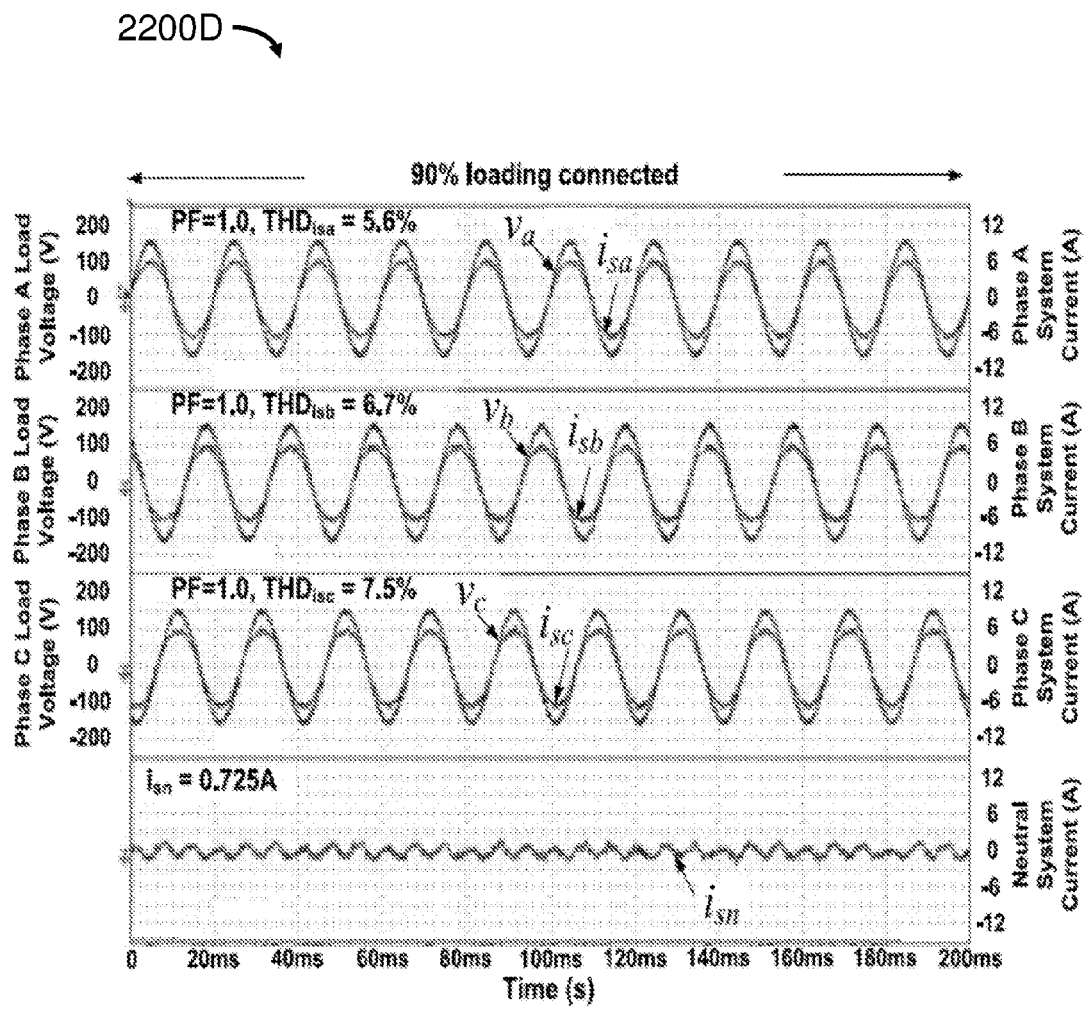
FIG. 22D shows a graph of a voltage and current of a three-phase power system after HAPF compensation with a mixed signal controller at 90% loading in accordance with an example embodiment.

FIG. 19 shows a graph 1900 of a simulated voltage and current of the system after HAPF compensation in accordance with an example embodiment. The X-axis shows time in seconds, and the Y-axis shows voltage in volts and current in amperes.

As one example, the simulated THD values satisfy the requirement of less than 20% under both 50% and 90% loading conditions after HAPF compensation. Moreover, the PF are improved to unity. The HAPF compensation performance is satisfactory under both light loading and full loading.

FIG. 20A-20D show graphs 2000A-2000D of voltages and currents of a three-phase power system before compensation at 20% loading, 50% loading, 70% loading and 90% loading. The X-axis shows time in seconds, and the Y-axis shows voltage in volts and current in amperes.

FIG. 21A-21D show graphs 2100A-2100D of voltages and currents of a three-phase power system after HAPF compensation with a digital controller at 20% loading, 50% loading, 70% loading and 90% loading. The X-axis shows time in seconds, and the Y-axis shows voltage in volts and current in amperes.

FIG. 22A-22D show graphs 2200A-2200D of voltages and currents of a three-phase power system after HAPF compensation with a mixed signal controller at 20% loading, 50% loading, 70% loading and 90% loading. The X-axis shows time in seconds, and the Y-axis shows voltage in volts and current in amperes.

By way of example, the three-phase power system with the mixed signal controller achieves best compensation performance, particularly under light loading conditions. As shown in FIG. 22A-22D, the THD values in phase "a" are improved to 13.9%, 10.8%, 5.7%, and 5.6%, at 20% loading, 50% loading, 70% loading and 90% loading, respectively. With a conventional digital controller as shown in FIG. 21A-21D, the THD at 20% loading fails to meet the requirement of less than 20%.

FIG. 23 summarizes experimental compensation results of a three-phase power system after HAPF compensation with a digital controller compared with a mixed signal controller in table 2300. It summarizes the power quality parameters as shown in FIG. 20-22 for different testing loads before and after compensation.

Figure 24A:
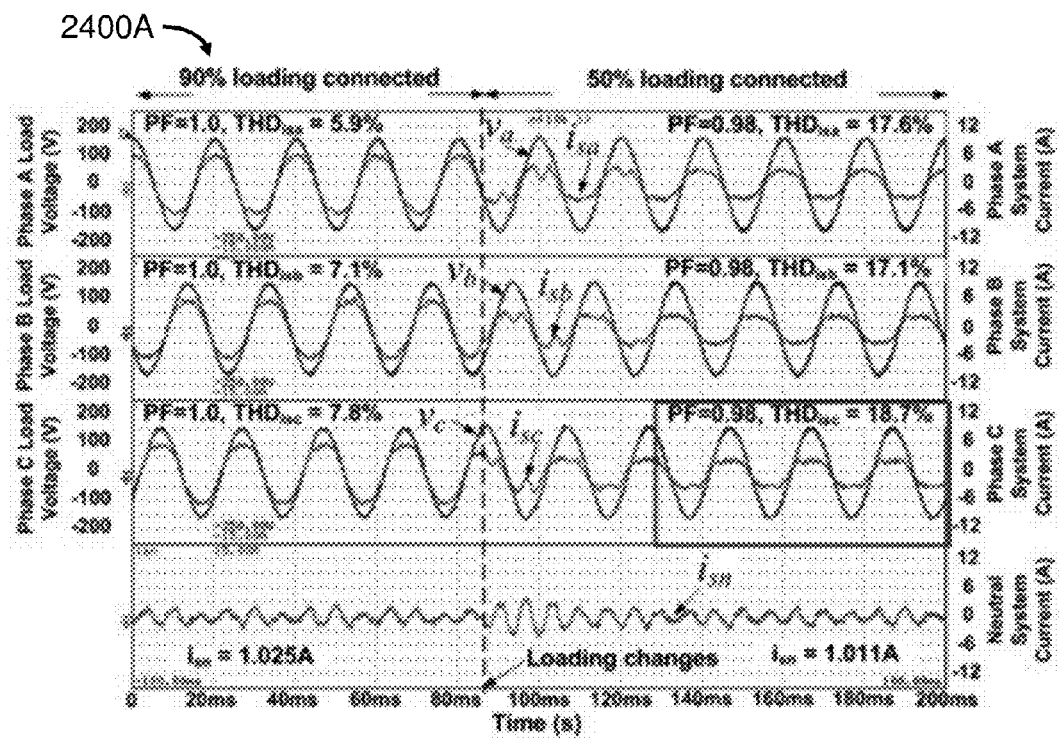
FIG. 24A shows a graph of a voltage and current of a three-phase power system after HAPF compensation with a digital controller during loading changes in accordance with an example embodiment.

FIG. 24A shows a graph 2400A of a voltage and current of a three-phase power system after HAPF compensation with a digital controller during loading changes in accordance with an example embodiment. The X-axis shows time in seconds, and the Y-axis shows voltage in volts and current in amperes.

Figure 24B:
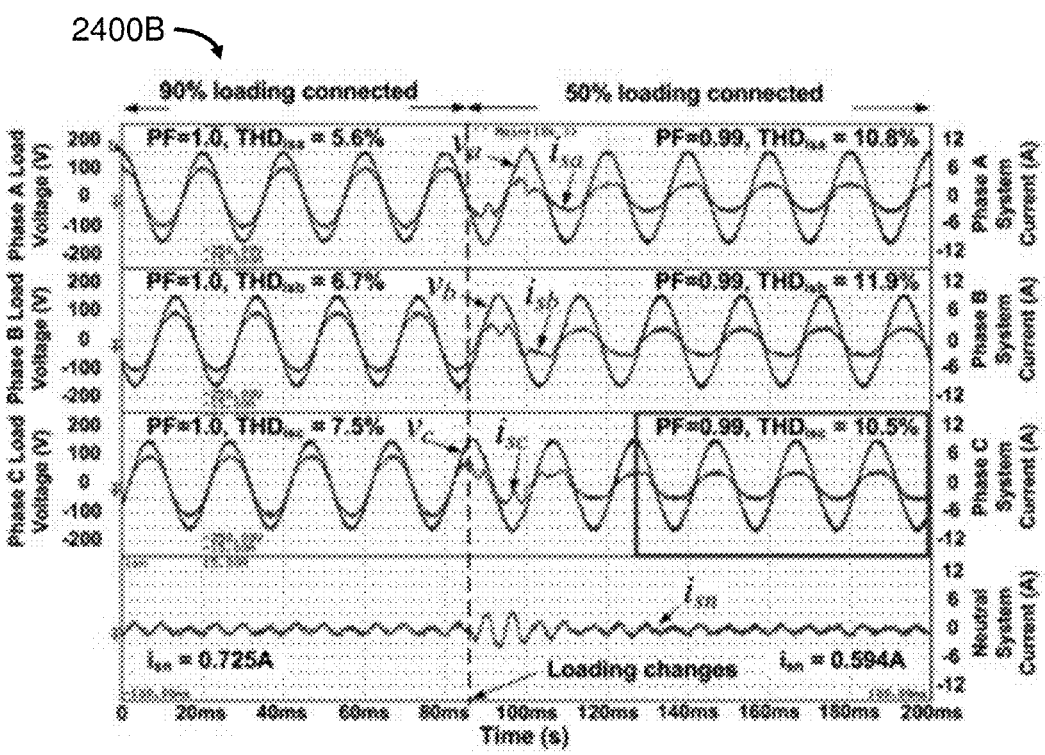
FIG. 24B shows a graph of a voltage and current of a three-phase power system after HAPF compensation with a mixed signal controller during loading changes in accordance with an example embodiment.

FIG. 24B shows a graph 2400B of a voltage and current of a three-phase power system after HAPF compensation with a mixed signal controller during loading changes in accordance with an example embodiment. The X-axis shows time in seconds, and the Y-axis shows voltage in volts and current in amperes.

By way of example, the dynamic compensation performance during loading changes with the conventional controller (as shown in FIG. 24A) and with the mixed signal controller (as shown in FIG. 24B) is compared. The dynamic response time of both controllers is less than two cycles, which verifies the fast dynamic response of the mixed signal controller and the function of on-the-fly mixed signal reconfiguration.

As used herein, a "hybrid active power filter" or "HAPF" is one of the power compensation systems with passive filters and active power filters that compensates harmonic current and reactive power.

As used herein, "pulse width modulation" or "PWM" is a process of modifying the width of pulses in a pulse train in proportion to a control signal.

As used herein, a "hysteresis band" or "HB" is a numerical range that specifies a variation of current.

As used herein, a "power factor" or "PF" is the ratio of the real power flowing to the load to the apparent power in the circuit of an electrical power system.

As used herein, a "power quality compensator" is an electronic system for a power supply. Examples of power quality compensators include, but are not limited to, passive power filters (PPFs), active power filters (APFs), and hybrid active power filters (HAPFs).

The systems and methods in accordance with example embodiments are provided as examples, and examples from one system or method should not be construed to limit examples from another system or method. Further, methods discussed within different figures can be added to or exchanged with methods in other figures. Further yet, specific numerical data values (such as specific quantities, numbers, categories, etc.) or other specific information should be interpreted as illustrative for discussing example embodiments. Such specific information is not provided to limit example embodiments.

What is claimed is:

1. A mixed signal controller for a power quality compensator, comprising:

an analog circuit that amplifies an input signal from the power quality compensator by a first gain factor and outputs an analog signal;

an analog-to-digital converter (ADC) that converts the analog signal to a digital signal; and a digital circuit that receives the digital signal and generates a trigger signal to the power quality compensator, wherein the digital circuit further includes an evaluation circuit that calculates a value of a system total harmonic distortion after the power quality compensator compensates power and adjusts the first gain factor of the analog circuit in real time to decrease the system total harmonic distortion by comparing the first gain factor with a second gain factor represented by:

$$G = INT\left(\frac{W}{R}\right)$$

where INT is an integer function, W is a measured amplitude width of the digital signal out of the ADC, and R is a peak-to-peak range of the input signal.

2. The mixed signal controller of claim 1, wherein the value of the system total harmonic distortion is an approximate total harmonic distortion (ATHD) that is calculated instantaneously without frequency spectrum computation by:

$$ATHD = \sqrt{\frac{2}{3}\frac{HB}{I_{1p}}}$$

where HB is a hysteresis band value that specifies a variation range of the current, and $I_{1p}$ is a peak value of a sinusoidal current that is determined instantaneously by:

$$I_{1p} = \frac{\sqrt{2} \cdot \overline{p}}{\sqrt{3} \, \|\Delta\|}$$

where $\|\Delta\| = \sqrt{v_a^2 + v_b^2 + v_c^2}$, $\overline{p}$ is an average active power, and $v_a$, $v_b$, and $v_c$ are voltages at phases a, b, and c.

3. The mixed signal controller of claim 1, wherein the trigger signal is a pulse width modulation (PWM) signal that controls a switching device of the power quality compensator.

4. The mixed signal controller of claim 1, wherein the value of the system total harmonic distortion is dependent on a compensation error that is limited by the ADC.

5. The mixed signal controller of claim 1, wherein the value of the system total harmonic distortion is dependent on a value of the first gain factor.

6. The mixed signal controller of claim 1, wherein the digital circuit further includes a calculation circuit that calculates the second gain factor and sends the second gain factor to the analog circuit, wherein the analog circuit compares the second gain factor to a predetermined value and adjusts the first gain factor to decrease the system total harmonic distortion after the power quality compensator compensates power when the second factor is different than the predetermined value.

7. The mixed signal controller of claim 1, wherein the analog circuit compares the second gain factor sent from the digital circuit with a predetermined value and adjusts the first gain factor when the second gain factor is different than the predetermined value.

8. A method executed by a mixed signal controller that controls a power quality compensator, the method comprising:
    amplifying, by an analog circuit and by a first gain factor, an input signal from the power quality compensator to generate an analog signal;
    converting, by an analog-to-digital converter (ADC), the analog signal to a digital signal;
    receiving, by a digital circuit, the digital signal from the ADC;
    calculating, by the digital circuit, a value of a system total harmonic distortion after the power quality compensator compensates power;
    calculating, by the digital circuit, a second gain factor that is sent to the analog circuit;
    adjusting, by the analog circuit and based on the second gain factor, the first gain factor to decrease the value of the system total harmonic distortion; and
    sending, by the digital circuit, a pulse width modulation (PWM) signal to the power quality compensator,
    wherein the second gain factor is calculated by:

$$G = INT\left(\frac{W}{R}\right)$$

where INT is an integer function, W is a measured amplitude width of the digital signal out of the ADC, and R is a peak-to-peak range of the input signal.

9. The method of claim 8, wherein the value of the system total harmonic distortion is an approximate total harmonic distortion (ATHD) that is calculated instantaneously without frequency spectrum computation by:

$$ATHD = \sqrt{\frac{2}{3}} \frac{HB}{I_{1p}}$$

where HB is a hysteresis band value that specifies a variation range of the current, and $I_{1p}$ is a peak value of a sinusoidal current that is determined instantaneously by:

$$I_{1p} = \frac{\sqrt{2} \cdot \overline{p}}{\sqrt{3} \, \|\Delta\|}$$

where $\|\Delta\| = \sqrt{v_a^2 + v_b^2 + v_c^2}$, $\overline{p}$ is an average active power, and $v_a$, $v_b$, and $v_c$ are voltages at phases a, b, and c.

10. The method of claim 8, wherein the value of the system total harmonic distortion is dependent on a compensation error that is limited by the ADC.

11. The method of claim 8, wherein the value of the system total harmonic distortion is dependent on a value of the first gain factor.

12. The method of claim 8, further comprising:
    comparing, by the analog circuit, the second gain factor with a predetermined value; and
    adjusting, by the analog circuit, the first gain factor when the second gain factor is different than the predetermined value.

13. A mixed signal controller for a power quality compensator, comprising:
    an analog circuit that filters an input signal from the power quality compensator by a first factor and outputs an analog signal;
    an analog-to-digital converter (ADC) that converts the analog signal to a digital signal; and
    a digital circuit that receives the digital signal from the ADC and generates a pulse width modulation (PWM) signal that triggers the power quality compensator,
    wherein the digital circuit further includes a calculation circuit that calculates a second factor and sends the second factor to the analog circuit, the second factor represented by:

$$G = INT\left(\frac{W}{R}\right)$$

where INT is an integer function, W is a measured amplitude width of the digital signal out of the ADC, and R is a peak-to-peak range of the input signal,
    wherein the analog circuit compares the second factor to a predetermined value and adjusts the first factor to decrease a system total harmonic distortion after the power quality compensator compensates power when the second factor is different than the predetermined value.

14. The mixed signal controller of claim 13, wherein the digital circuit further includes an evaluation circuit that calculates a value of the system total harmonic distortion after the power quality compensator compensates power by calculating an approximate total harmonic distortion (ATHD) by:

$$ATHD = \sqrt{\frac{2}{3}} \frac{HB}{I_{1p}}$$

where $I_{1p}$ is a peak value of a sinusoidal current, and HB is a hysteresis band value that specifies a variation range of the current.

15. The mixed signal controller of claim 13, wherein the ATHD is dependent on a compensation error that is limited by the ADC.

16. The mixed signal controller of claim 13, wherein the ATHD is dependent on a value of the first factor.

17. The mixed signal controller of claim 13, wherein the analog circuit compares the second factor with a predetermined value and adjusts the first factor when the second factor is different than the predetermined value.

\* \* \* \* \*